United States Patent [19]

Pruitt

[11] Patent Number: 4,691,270

[45] Date of Patent: Sep. 1, 1987

[54] CURRENT FED INVERTER BRIDGE WITH LOSSLESS SNUBBERS

[75] Inventor: Duard L. Pruitt, Burlington County, N.J.

[73] Assignee: RCA Corporation, Princeton, N.J.

[21] Appl. No.: 887,918

[22] Filed: Jul. 22, 1986

[51] Int. Cl.[4] ............................................ H02H 7/122
[52] U.S. Cl. ...................................... 363/56; 363/132
[58] Field of Search ................... 363/17, 56, 73, 98, 363/132

[56] References Cited

U.S. PATENT DOCUMENTS

| | | | |
|---|---|---|---|
| 4,264,949 | 4/1981 | Simmons et al. | 363/17 |
| 4,268,898 | 5/1981 | Brown | 363/56 |
| 4,276,588 | 6/1981 | McLyman et al. | 363/56 |
| 4,319,359 | 3/1982 | Wolf | 375/22 |
| 4,336,587 | 6/1982 | Boettcher, Jr. et al. | 363/56 |
| 4,378,586 | 3/1983 | Bete | 363/56 |
| 4,438,486 | 3/1984 | Ferraro | 363/56 |
| 4,502,085 | 2/1985 | Morrison et al. | 361/56 |
| 4,555,754 | 11/1985 | Hennevin | 363/56 |
| 4,566,059 | 1/1986 | Gallios et al. | 363/56 |

OTHER PUBLICATIONS

Whitcomb; "Designing Non-Dissipative Current Snubbers For Switched Mode Converters"; Powercon 6, May 1979.

Shaughnessy; "Modelling and Design of Non-Dissipative LC Snubber Networks"; Powercon 7, Mar. 1980.

Sathe; "Coupled Inductor Lossless Snubber Circuit . . . "; IBM Technical Disclosure Bulletin, vol. 26, No. 10A, 3/84.

Primary Examiner—Patrick R. Salce
Assistant Examiner—Jeffrey Sterrett
Attorney, Agent, or Firm—Clement A. Berard, Jr.; William H. Meise

[57] ABSTRACT

A DC-to-AC inverter includes a switched bridge circuit. The bridge is energized by a source of substantially constant direct current. In order to reduce stress on the switches of the bridge, periods of conductivity of the switches of the bridge are overlapped, so that all the legs of the bridge are conductive simultaneously in two operating intervals out of a recurrent operating sequence of four operating intervals. Each switch is associated with a snubber circuit including a snubber capacitor which bypasses or absorbs switch current during turn-off. The charge retained on the snubber capacitor after complete turn-off of the associated switch represents energy which can be reused. The capacitor must be discharged in readiness for the next turn-off of the associated switch. An energy recovery circuit associated with each snubber includes a transformer, the primary of which is coupled to the associated snubber capacitor for receiving a current pulse at a time near the beginning of one of the four intervals of the recurrent operating sequence. A secondary of the transformer of each energy recovery circuit is coupled to the energizing source for returning energy to the source while discharging the associated snubber capacitor.

10 Claims, 20 Drawing Figures

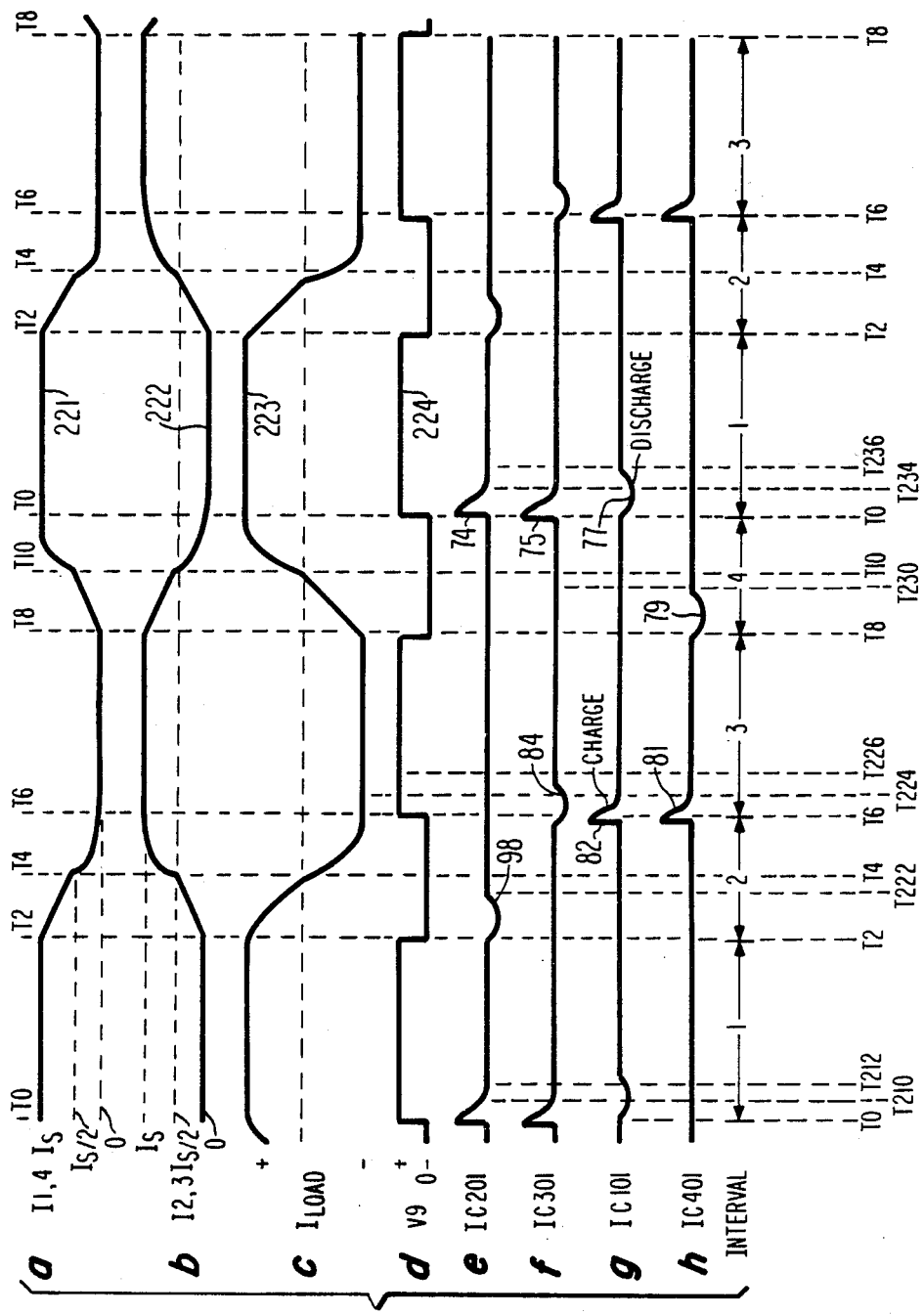

CURRENT FED INVERTER BRIDGE WITH LOSSLESS SNUBBERS

This invention relates to inverter bridges suitable for high power, high frequency use, in which switch stresses are reduced by snubber circuits which return energy to the power source.

BACKGROUND OF THE INVENTION

Modern high power transmitters such as those used for television or for radar transmission require vacuum tubes which operate at relatively high voltages and which draw substantial amounts of current. It is relatively easy to supply direct high voltage at high current by applying alternating current from the power mains to the primary winding of a transformer, the secondary winding of which produces a high alternating voltage. High voltage rectifiers are connected to the second winding of the transformer to rectify the alternating current to produce direct current. Filter capacitors may be used to reduce voltage ripple. Such an arrangement tends to be bulky and expensive, because of the large physical size of the transformer required for operation at 50 or 60 Hertz (Hz) power line frequencies and because of the very large values of filter capacitance and associated working voltage of the requisite filter capacitors.

It is known that operation of a transformer at high frequencies, such as 1000 to 10,000 Hz, can effect a significant reduction in physical size. Furthermore, operation at high frequencies reduces the capacitance of the requisite filter capacitors in proportion to the ratio of frequencies. It is often desirable to operate an inverter at a frequency which is equal to or a multiple of the operating frequency of the system being powered. For example, in television practice, it is common to operate the high voltage kinescope power supply at 15,750 Hz, which is the horizontal deflection frequency.

In order to generate the high frequency drive for the primary of a voltage step-up transformer, it is common to produce a relatively low direct voltage by rectifying and filtering the power mains, and to apply the relatively low direct voltage so produced to a switched bridge inverter in order to generate an alternating potential at a high frequency which may be applied to the primary winding of the step-up transformer. In order to maximize the efficiency of conversion of power from the alternating current power mains into radio frequency (RF) power, it is important to minimize losses in the high frequency inverter. These losses are for the most part associated with the solid state switching elements of the inverter, and include rise time loss, conduction loss and fall time loss. In most practical applications, rise time loss is relatively small, since circuit inductances limit the rise time of the currents. The presence of these inductances causes the voltage across the switching element to decrease to near zero before significant current flows through the switching device. Conduction loss through the solid state switching elements is minimized by proper selection of the switching device itself, by paralleling of the switching devices if necessary, and by application of sufficient switch drive. In the case of bipolar transistor switches, the switch drive is base current, and in the case of FET switches, the switch drive is gate voltage.

In a bipolar transistor inverter driven from a source of substantially constant voltage, the collector voltage of each switch transistor ordinarily rises to substantially its maximum value before the collector current begins to decrease at each turn-off interval. During the period when collector voltage is applied and collector current continues to flow, fall time losses occur. Fall time losses increase linearly as operating frequency is increased, and tend to be the most important of the losses in the inverter. In a bridge type inverter to which a substantially constant voltage is applied, fall time loss is proportional to the product of the peak voltage and current, the cross-over time and the frequency. Cross-over time is the time interval between the beginning of the voltage rise across a switch (commonly measured at the 10% point) until the end of the current fall (10% of the maximum value).

Switch stress and fall time losses can be reduced as described in patent application Ser. No. 850,813, entitled "Current Fed Inverter Bridge With Conduction Overlap And Load Tuning", filed Apr. 11, 1986, in the name of Pruitt, by driving the inverter bridge from a constant current source, and by operating the switches of the inverter in a recurrent sequence of four intervals, during two of which intervals all of the switches of the inverter are conductive, thereby short-circuiting the current source. During the short-circuited intervals, a resonant circuit is set up which causes oscillatory currents to flow through the conductive switches, which currents periodically reduce the net current through the switches in preparation for opening of (rendering nonconductive) the switches. Due to normal circuit tolerances, and also due to reduction in oscillatory current attributable to dissipative losses, or because of transfer of energy from the oscillatory circuit to the load, the oscillatory current may not reduce the current through a switch being opened to zero. A finite current therefore continues to flow through the switch as it is being opened, which results in stress on the switch.

It is desirable to reduce the stress on the switches of an inverter bridge operated in a current fed mode with overlapping conduction periods in a manner which does not dissipate large amounts of energy, and which does not require complex timing control.

SUMMARY OF THE INVENTION

A DC-to-AC inverter includes a switched bridge circuit which is energized by a source of substantially constant direct current which in turn is energized by a source of direct voltage. In order to reduce stress on the switches of the bridge, periods of conductivity of the switches of the bridge are overlapped, so that all legs of the bridge are conductive simultaneously during two operating intervals out of a recurrent operating sequence of four operating intervals. Each switch is associated with a snubber circuit which includes a capacitor which bypasses the nonzero current of a switch during switch turn-off. The charge retained on the capacitor of a snubber circuit after complete turn-off of the associated switch represents energy which can be re-used. The capacitor must be discharged in readiness for the next turn-off of the associated switch. An energy recovery circuit associated with each snubber includes a transformer having primary and secondary windings. The primary windings of the transformers of the snubber circuits associated with the upper switches of the inverter bridge are connected between the associated snubber capacitor and a terminal of the source of direct voltage. The primary windings of the transformers of the energy recovery circuits associated with the snubbers of the lower two switches of the bridge circuit are connected between the associated snubber capacitor and a terminal of the source of constant current. The secondary windings of the transformers of all four energy recovery circuits are coupled across the source of direct voltage for returning energy thereto during discharge of the snubber capacitors. Particular embodiments of the invention use steering diodes for effecting automatic snubber capacitor discharge and energy recovery, relying for control upon normal operation of the switches of the bridge.

DESCRIPTION OF THE DRAWINGS

FIG. 1m is a schematic diagram corresponding to FIG. 1a which illustrates current flows during the transition between the fourth operating interval and the first operating interval illustrated in FIG. 1a;

FIG. 2 is a timing diagram illustrating various currents flowing in the circuit illustrated in FIGS. 1a–1m during operation;

DETAILED DESCRIPTION OF THE INVENTION

Figure 1A:
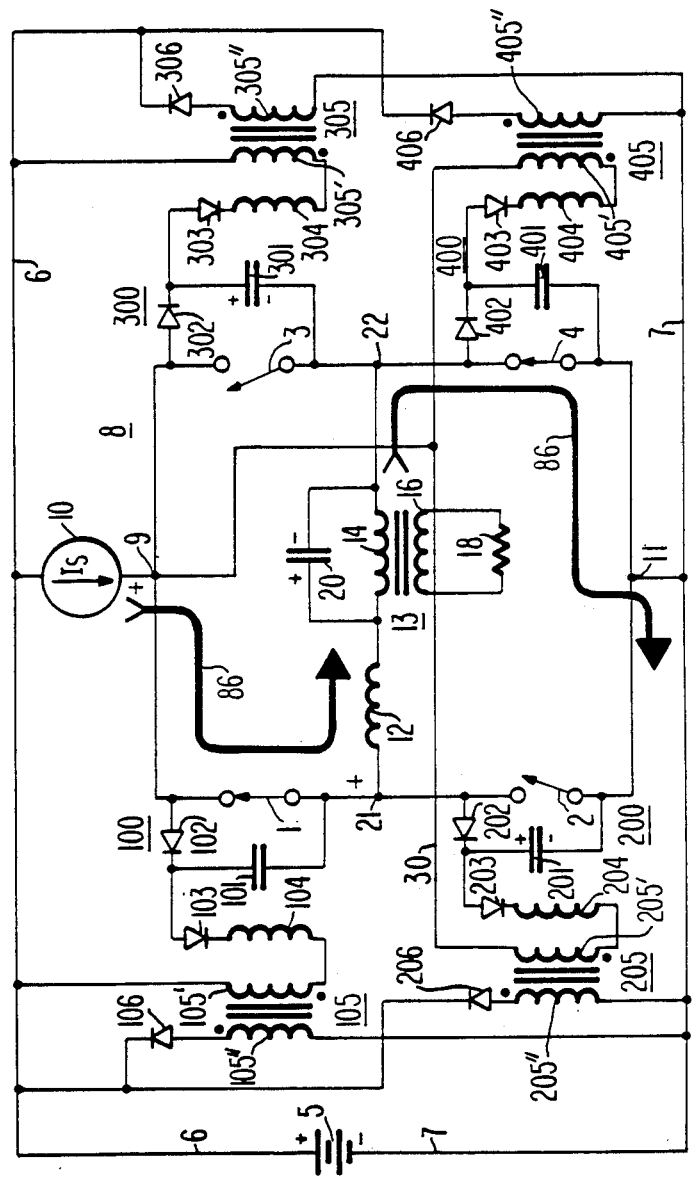
FIG. 1a is a simplified schematic diagram of a DC-to-AC inverter according to the invention, illustrating the status of snubber capacitor charge and the current flow during a first operating interval (T0–T2) of a recurrent sequence of four operating intervals.

FIG. 1a is a simplified schematic diagram of a current fed inverter illustrating currents which flow during an interval T0–T2 after transient conditions occurring near time T0 have stabilized. In FIG. 1a, a source 5 of direct voltage applies a positive voltage over a conductor 6 and a negative voltage over a conductor 7 to a bridge circuit designated generally as 8 and a current source illustrated as 10 which produces a substantially constant direct current at a node 9. As described in detail infra, source 10 produces a constant current between nodes 9 and 11 of inverter bridge 8. Node 11 is connected by conductor 7 to the negative terminal of voltage source 5. As indicated by the designation $I_S$, source 10 produces substantially constant direct current of magnitude $I_S$. Current $I_S$ is applied to terminal 9 of inverter bridge 8, and returns to source 5 by way of node 11 and conductor 7. Inverter bridge 8 includes a series combination of controllable switches 1 and 2 connected between nodes 9 and 11. Between switches 1 and 2 is a node 21. The series combination of further controllable switches 3 and 4 is connected in parallel with the series combination of switches 1 and 2 at terminals 9 and 11. Switches 3 and 4 have a node 22 at their juncture. Connected between nodes 21 and 22 is the series combination of an inductor 12 and the parallel combination of a capacitor 20 and the primary winding 14 of a transformer 13. Transformer 13 has a secondary winding 16 which drives a load represented by a resistor 18. If transformer 13 produces high voltage across secondary winding 16, load 18 may be a full-wave rectifier and filter capacitor. In effect, primary winding 14 is the load which is driven by inverter circuit 8, and secondary winding 16 and its associated resistor 18 may be ignored for purposes of understanding operation of the inverter.

As illustrated in FIG. 1a, switches 1 and 4 are closed or conductive, while switches 2 and 3 are open or nonconductive. As indicated by the legend T0–T2 of FIG. 1a, the illustrated switch configuration is that occurring in interval T0–T2, which is the first interval of a recurrent cycle of four intervals, as described in more detail below. The illustrated current flows are those occurring in the interval T0–T2 after transient conditions have died out. With switches 1 and 4 closed, a current 86 of magnitude $I_S$ (illustrated by heavy shading) flows from source 10, past node 9, through switch 1, through node 21, and from node 21 flows through inductor 12 and primary winding 14 to node 22. Current $I_S$ then flows from node 22 through closed switch 4 back to the negative terminal of voltage source 5 by way of node 11 and conductor 7. The flow of current 86 from left to right through primary winding 14 causes a voltage drop across winding 14 which causes capacitor 20 to assume a charge having a polarity illustrated in FIG. 1a by plus (+) and minus (−) symbols. So long as the switch configuration is not altered, inverter 8 will remain in the illustrated condition indefinitely.

Node 9 is connected to the anode of a diode or rectifier 102, the cathode of which is coupled by way of a capacitor 101 to node 21. The series combination of capacitor 101 and diode 102 constitutes a snubbing circuit 100 coupled across switch 1. As known, a snubbing circuit connected across a switch is effective to absorb current which otherwise would flow through the switch with which it is associated during switch turn-off. The operation of a snubber in association with a switch may be understood by considering that, as the impedance of the switch increases during turn-off, the current then flowing through the switch causes an increase in the voltage across the switch. The increase in voltage causes conduction through the diode and capacitor of the associated snubber when the voltage exceeds the voltage then existing across the capacitor plus the diode offset or junction voltage.

A snubber circuit 200 consisting of a doide 202 having its anode connected to node 21 and its cathode connected by way of a capacitor 201 to node 11 is connected across switch 2. A diode 302 having its anode connected to node 9 and its cathode connected by way a capacitor 301 to node 22 constitutes a snubber 300 connected across switch 3 of inverter bridge 8. Similarly, a diode 402 having its anode connected to node 22 and its cathode connected by way of a capacitor 401 to node 11 constitutes a snubber connected across switch 4. As illustrated in FIG. 1a in the interval T0–T2, capacitors 201 and 301 are charged in the polarity illustrated as a result of previous operation of the inverter bridge, while capacitors 101 and 401 are uncharged. Because capacitors 101 and 401 are uncharged, they are in a condition capable of absorbing or bypassing current away from switches 1 and 4, respectively, which arises due to the next turn-off of switches 1 and 4, which occurs in due course during normal operation of the switches of inverter bridge 8. Capacitors 201 and 301, on the other hand, have a substantial charge thereacross which would tend to reduce their current bypassing capability, and capacitors 201 and 301 must therefore be discharged before the next turn-off interval of switches 2 and 3, respectively.

FIG. 2a illustrates as waveform 221 the current flow in either of switches 1 or 4 as a function of time. As illustrated in FIG. 2a, current waveform 221 has a magnitude of $I_S$ in the interval T0–T2, corresponding to current flow having magnitude $I_S$ in either of switches 1 or 4. FIG. 2b illustrates as waveform 222 the current flow in either switches 2 or 3. In the interval T0–T2, current waveform 222 has zero magnitude, corresponding to no current flow. This is expected, since switches 2 and 3 are open during interval T0–T2. FIG. 2c illustrates as waveform 223 the magnitude of the current flow through the load (through primary winding 14) as a function of time. As illustrated in interval T0–T2, the magnitude of current waveform 223 is $+I_S$. The positive (+) direction of current flow is conventional current flow from left to right, as illustrated in FIG. 1a. FIG. 2d illustrates as waveform 224 the magnitude of the voltage between nodes 9 and 11 as a function of time. As illustrated in the interval T0–T2, the voltage is high orpositive, as illustrated by the plus symbol. The magnitude of the voltage between terminals 9 and 11 is determined by the magnitude of current $I_S$ and of the impedance between terminals 9 and 11, which includes the impedance of inductor 12 and the transformed impedance presented by winding 14 of transformer 13, together with the on-state resistances of 1 and 4.

Figure 1B:
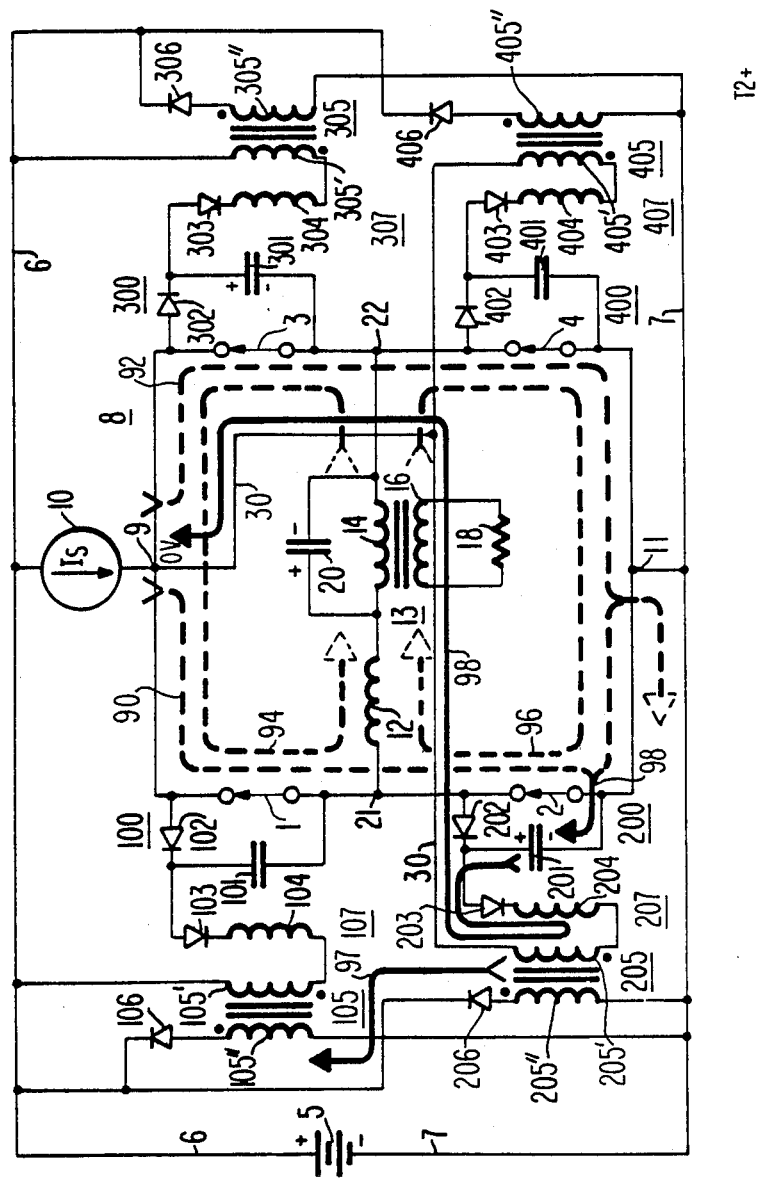
FIG. 1b is a schematic diagram corresponding to that of FIG. 1a illustrating current flows during a transition between first and second operating intervals of the recurrent sequence of four operating intervals.

FIG. 1b illustrates inverter bridge 8 during the transition between the first operating mode which exists during the first interval T0–T2 of the recurrent sequence of four intervals as illustrated in FIG. 1a and a second mode of operation which exists during a second interval of the recurrent sequence. The second interval extends from time T2 until a time T6, as described below in conjunction with FIG. 1c, 1d and 1e. FIG. 1b, however, pertains only to the transition between the first and second intervals in order to better explain the flow of currents resulting from the transition. For this reason, FIG. 1b is identified by the legend T2+. At time T2, switches 2 and 3 are rendered conductive or closed, whereby all four switches (1, 2, 3 and 4) are conductive. Consequently, nodes 9 and 11 are short-circuited, and the voltage between nodes 9 and 11 drops to zero, as illustrated by waveform 224 of FIG. 2d. It should be noted that the magnitude of the current flow from source 10 does not change when it is short-circuited, because of its relatively high internal impedance, which maintains substantially constant current flow at all load impedances. Current having a magnitude $I_S$ flowing from source 10 may be viewed as dividing at terminal 9 into two equal portions, each having a magnitude of $I_S/2$, one of which portions (illustrated by dotted lines and designated 90) flows from terminal 9 through switch 1, past node 21, and through switch 2 to node 11 to return by conductor 7 to the negative terminal of voltage source 5. The other portion of current $I_S$ leaving source 10, and having magnitude $I_S/2$, is designated 92 and is illustrated by dotted lines. Current 92 flows from terminal 9 through switch 3, past node 22, through switch 4 and past node 11, where it joins with first portion 90 of the current to return to the negative terminal of voltage source 5.

An energy recovery circuit 207 connected to capacitor 201 of snubber 200 includes a diode 203, the anode of which is connected to the cathode of diode 202 and the cathode of which is connected through an inductor 204 to one side of a primary winding 205' of a transformer 205. The other side of primary winding 205' is connected by a conductor 30 to node 9. As mentioned, node 9 has zero voltage relative to node 11 in the interval after time T2, and this is indicated by the symbol zero adjacent to node 9. Energy recovery circuit 207 coupled to snubber 200 also includes a secondary winding 205'' of transformer 205. One side of secondary winding 205'' is connected by conductor 7 to the negative terminal of voltage source 5. The other end of secondary winding 205'' is connected by the anode-to-cathode path of a diode 206 and by conductor 6 to the positive terminal of voltage source 5.

As mentioned in conjunction with the discussion of FIG. 1a, just before time T2, capacitor 201 was charged. At time T2, the voltage on conductor 30 drops suddenly as a result of short-circuiting between nodes 9 and 11 by the normal operation of inverter bridge 8. This closes a path for the discharge of capacitor 201 by way of diode 203, inductor 204, primary winding 205' conductor 30, node 9 and through short-circuited switches 1,2,3 and 4 back to the negative terminal of capacitor 201. The current flow in this path is illustrated by heavy lines in FIG. 1b and is designated 98. Current flow 98 is also illustrated in FIG. 2e. The dotted end of primary winding 205' is poled positive by the flow of current 98 therethrough and causes the dotted end of secondary winding 205'' to produce a stepped-up voltage pulse which is poled to produce a current 97 (illustrated by heavy lines) through diode 206. A voltage set-up ratio of about 2:1 is satisfactory in one embodiment of the invention. Current 97 returns to source 5 and results in the return of energy thereto. The charge on capacitor 201 at time T0 is sufficient to sustain current 98 for only a short period, and therefore the current dies out at a time such as T222 illustrated in FIG. 2. As described below, current pulse 98 is oscillatory.

Capacitor 301 of snubber 300 had a charge prior to time T2. The closing of all switches at time T2 does not discharge capacitor 301. Consequently, only capacitor 201 of snubber 200 is discharged by the transition at time T2.

Figure 1C:
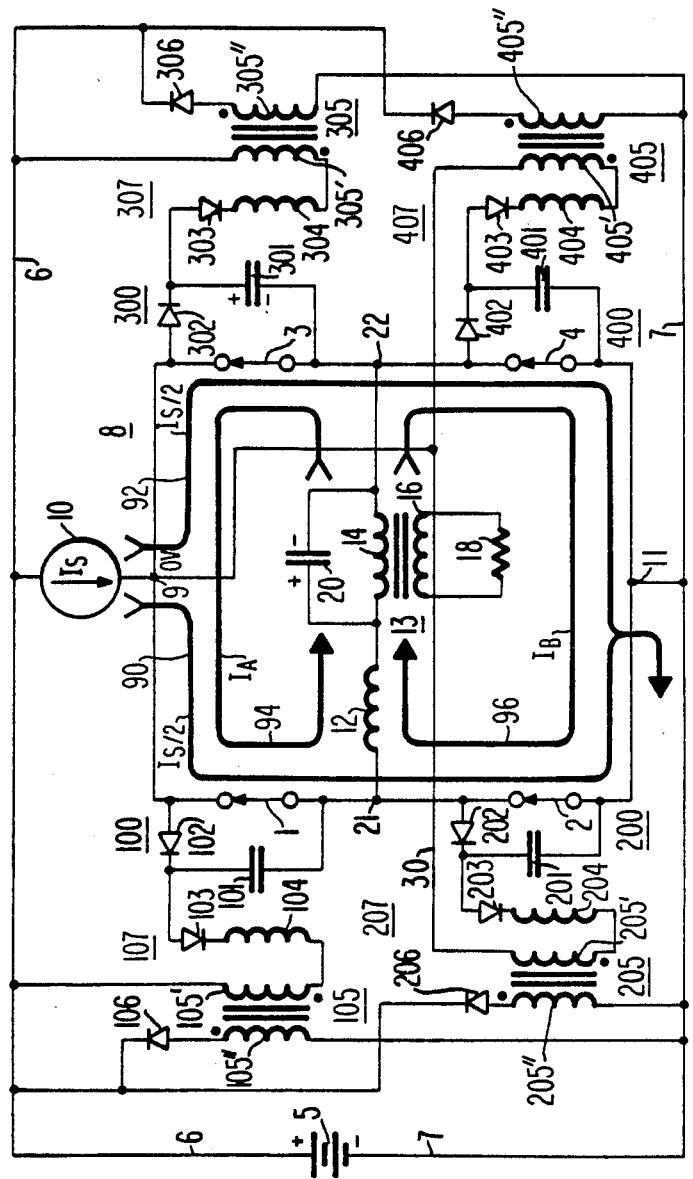
FIGS. 1c, 1d and 1e are schematic diagrams corresponding to FIG. 1a which illustrate snubber capacitor charge and current flows in the arrangement of FIG. 1a during the second operating interval (T2–T6) of the recurrent sequence.

Just before time T2, current was flowing from left to right through inductor 12 with magnitude $I_S$. As known, current flow through an inductor creates a magnetic field which tends to maintain the current when the drive is removed. When switches 2 and 3 were closed at time T2, thereby closing all four switches (1,2,3 and 4) and short-circuiting between nodes 9 and 11, a short-circuit was also created between nodes 21 and 22. With nodes 21 and 22 short-circuited, current continues to flow through inductor 12 and through the parallel combination of winding 14 and capacitor 20 as illustrated in FIG. 1c. FIG. 1c represents the currents flowing in the arrangement of FIG. 1a after the transient currents illustrated in FIG. 1b have died out. The current produced by inductor 12 divides when it reaches node 22, and half of the current (illustrated as 94) flows in a path designated $I_A$ which includes switch 3, node 9 and switch 1 back to inductor 12, and the other half of the current, illustrated as 96, flows in a path designated $I_B$ including switch 4, node 11, and switch 2 back to inductor 12. At instant T2, the magnitude of the current flowing through inductor 12 is $I_S$ and therefore currents 94 and 96 each have a magnitude of $I_S/2$. At moment T2, current 94 having magnitude $I_S/2$ opposes that portion of current 92 flowing in switch 3 attributable to short-circuiting of source 10, which also has magnitude $I_S/2$. Consequently, at time T2, the current flow through switch 3 has a net magnitude of zero. The current through switch 1 at time T2 is the sum of current 90 having magnitude $I_S/2$ and current 94 also having magnitude $I_S/2$. Consequently, at time T2 the current flowing in switch 1 has a sum magnitude of $I_S$. Similarly, at time T2, current 96 having magnitude $I_S/2$ adds in switch 4 to current 92 flowing in switch 4 due to the short-circuiting of source 10 to produce a sum current having magnitude $I_S$, and subtracts from current 90 flowing in switch 2 attributable to short-circuiting of source 10 for a net current of zero. Remarkably, the current flow in switches 1,2,3 and 4 is exactly the same (except for the current flow attributable to the discharge of capacitor 201) immediately before and immediately after time T2, notwithstanding that at time T2 all the switches are rendered conductive.

During the interval T2–T4 (FIG. 1c), the energy stored in inductor 12 decreases as energy is transferred to winding 14. As a result, the current flow through inductor 12 (and therefore currents 94 and 96) decreases in magnitude. The current through the load also decreases in the interval T2–T4, as illustrated by current 223 of FIG. 2c. The voltage across capacitor 12 in the interval T2–T4 depends upon the type of load on secondary winding 16 of transformer 14. If the load is resistive, the voltage across capacitor 20 decreases in proportion to the current through inductor 12. If, as mentioned above, resistor 18 represents a full wave rectifier feeding a capacitor filter, the voltage across capacitor 20 remains constant at its maximum value until inductor 12 completes its discharge to zero current at time T4.

Figure 1D:
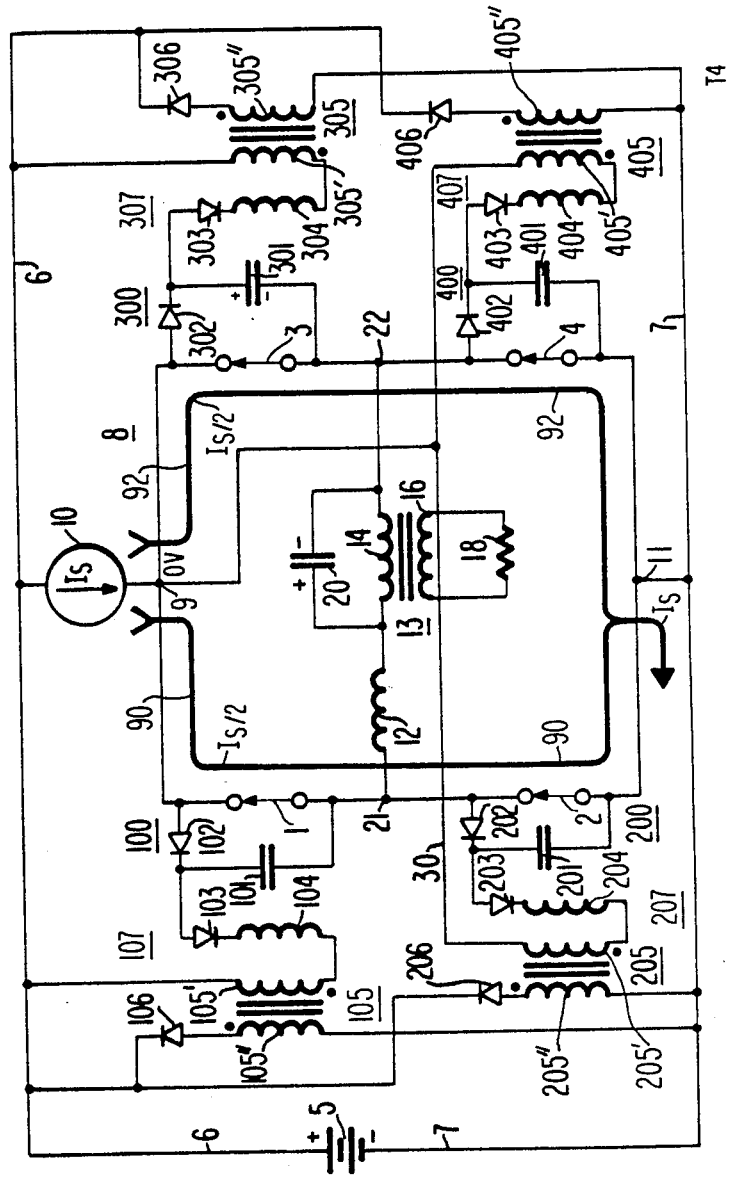
Figure 1E:
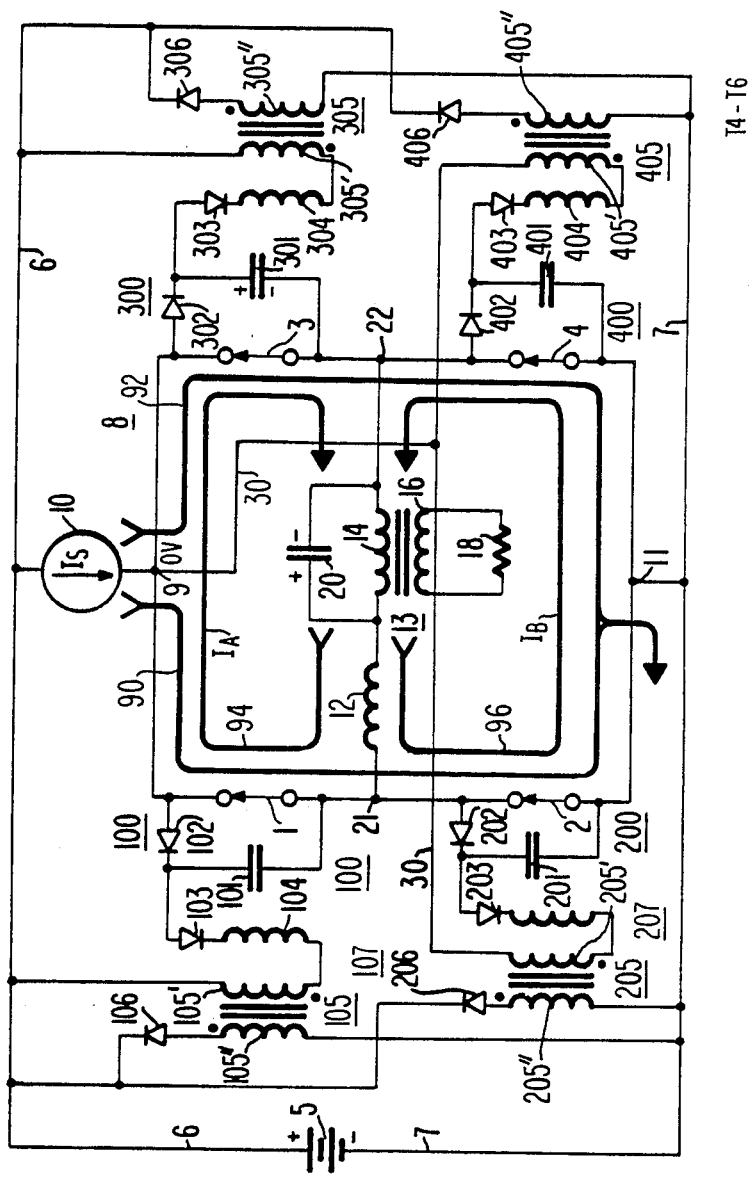

At time T4, the energy stored in the form of magnetic fields about conductor 12 is exhausted. FIG. 1d illustrates the state of inverter bridge 8 at time T4. As illustrated in FIG. 1d, current 90 having magnitude $I_S/2$ continues to flow through switches 1 and 2, and current 92 having magnitude $I_S/2$ continues to flow through switches 3 and 4 due to the short-circuiting of source 10. Currents 94 and 96 which previously flowed in current paths $I_A$ and $I_B$ are not shown, because they have zero magnitude. Currents 221 (current through switches 1 or 4) and 222 (current in switches 2 or 3) as illustrated in FIGS. 2a and 2b have magnitude $I_S/2$ at time T4, and load current 223 has zero magnitude as illuatrated in FIG. 2c. For a rectifier-capacitor load as described above, current begins to flow immediately after time T4 in a reverse or negative (−) direction (to the left) through inductor 12 under the impetus of the voltage across charged capacitor 20, poled as illustrated in FIG. 1e. The reversal of current polarity is indicated by the direction of the arrows of currents 94 and 96 in FIG. 1e, and is indicated by the direction of excursion of waveform 223 of FIG. 2c in the interval T4–T6.

FIG. 1e illustrates the current flow during the interval T4–T6. During interval T4–T6, switches 1,2,3 and 4 continue to be closed, maintaining a short-circuit across source 10 and also short-circuiting nodes 21 and 22 together by current paths $I_A$ and $I_B$. An increasing negative current flows through capacitor 20 and inductor 12, dividing at node 21 into current 94 which flows by path $I_A$ and current 96 which flows by path $I_B$ back to capacitor 20 by way of node 22. The increasing magnitude of current 94 subtracts from current 90 flowing through switch 1, causing the current therethrough to decrease as illustrated in the interval T4–T6 by waveform 221 of FIG. 2a. The increasing current 94 adds to current 92 flowing through switch 3 to produce an increasing net current, as illustrated by waveform 222 in the interval T4–T6. The increasing magnitude of current 96 flowing in path $I_B$ similarly decreases the net current flow through switch 4 and increases the net current flow through switch 2. At time T6, the net current flow (221 of FIG. 2a) through switches 1 and 4 is minimized. Also at time T6, the current in switches 2 and 3 (222 of FIG. 2b) reaches a maximum value.

Intervals T2–T4 and T4–T6, during which all four switches are closed, together constitute the second of the four operating intervals of the recurrent sequence of operating intervals. No change occurs in the state of charge of snubber capacitors 101, 201, 301 and 401 through the principal portion of the second operating interval, which ends with a charge only on capacitor 301.

Figure 1F:
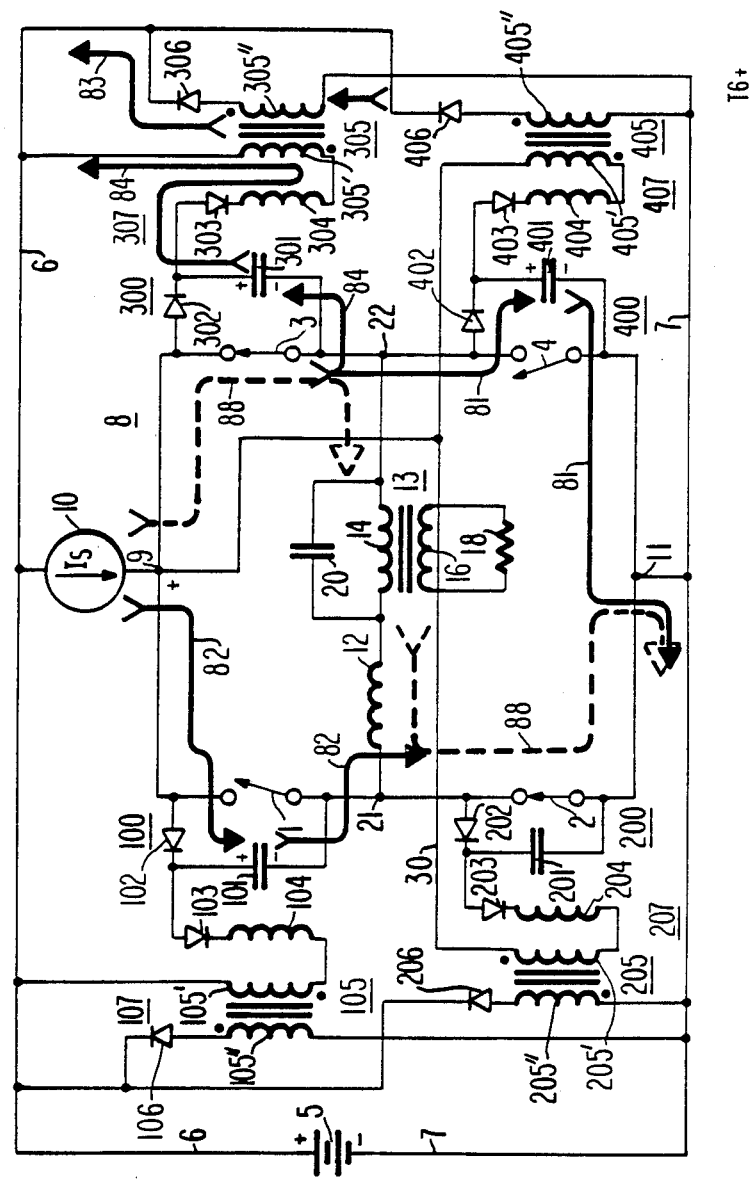
FIG. 1f is a schematic diagram corresponding to FIG. 1a illustrating current flows during a transition between the second and a third operating interval of the recurrent sequence.

Switches 1 and 4 are opened or rendered nonconductive at time T6 to assume the configuration illustrated in FIG. 1f to begin a third interval of the recurrent cycle of four intervals. The opening of switches 1 and 4 occurs, as mentioned, at a time when minimum current flows therethrough. FIG. 1f illustrates the transient currents which flow through the snubber capacitors in the moments after time T6 which result from the opening of switches 1 and 4, and FIG. 1f therefore bears the legend T6+. As mentioned, the third operating interval begins at time T6 with a charge on capacitor 301. At time T6, switches 1 and 4 become nonconductive, removing the short-circuit between nodes 9 and 11. The voltage at node 9 therefore assumes a finite voltage relative to node 11, as illustrated by the step rise of waveform 224 of FIG. 2d, and as suggested by the symbol + adjacent to node 9. Node 21 continues to be held at the same voltage as node 11 due to conductive switch 2. Node 22 is connected to node 9 by conductive switch 3, and therefore the voltage at node 22 takes a positive-going transition. The positive-going transition at node 22 causes the negatively charged electrode of capacitor 301 to assume the voltage of node 9, and consequently the positively charged electrode of capacitor 301 is raised to a voltage greater than that on conductor 6. This condition forward-biases diode 303 and allows a current 84 illustrated by heavy lines to flow by a path including capacitor 301, diode 303, inductor 304, primary winding 305' of a transformer 305 and conductor 6 back to the positive terminal of voltage source 5. The current path is completed by current flows from capacitor 301 to node 22, from which several paths are available for current flow to the negative terminal of voltage source 5. Current 84 is also illustrated in FIGURE 2f. The dotted end of primary winding 305' is poled positive by the flow of current 84 therethrough, which causes the dotted end of secondary winding 305" to produce a stepped-up voltage pulse which is poled to produce a current 83 (illustrated by heavy shading) through diode 306. Current 83 returns to source 5 and results in the return of energy thereto, during the discharge of capacitor 301 by current flow 84. The charge on capacitor 301 at time T6 is sufficient to sustain current 84 for only a short period, and therefore the current dies out at a time such as time T226 illustrated in FIG. 2.

The opening of switch 1 at time T6 results in a current flow illustrated in heavy lines as 82 through diode 102 of snubber 100 for charging capacitor 101 of snubber 100, thereby reducing switching stress on switch 1. The charging current through capacitor 101 is illustrated by 82 of FIG. 2g. This current dies down at a time T224 as illustrated in FIG. 2. Similarly, the opening of switch 4 results in a flow of current 81 also illustrated by heavy shading, which results in a charge on capacitor 401 of snubber 400 while reducing switching stress on switch 4. Thus, the transition between the second operating interval (times T2-T6) and the third operating interval (times T6-T10) results in discharge of capacitor 301, and also results in the charging of snubber capacitors 101 and 401. The snubber capacitor charging currents 81 and 82 attributable to the opening of their associated switches is of short duration, and dies out at a time such as time T224 of FIG. 2, as illustrated in FIGS. 2g and 2h.

Just before time T6, current was flowing from right to left through inductor 12 and primary winding 14 with magnitude $I_S$. During the interval T6-T8 during which the switch configuration remains in the condition illustrated in FIG. 1g, current illustrated in heavy lines as 80 continues to flow with magnitude $I_S$ through inductor 12 and primary winding 14. Capacitors 101 and 401 maintain their charge in the interval T6-T8, and capacitors 201 and 301 remain uncharged. The condition of FIG. 1g will be maintained indefinitely unless the switch configuration is altered.

Figure 1G:
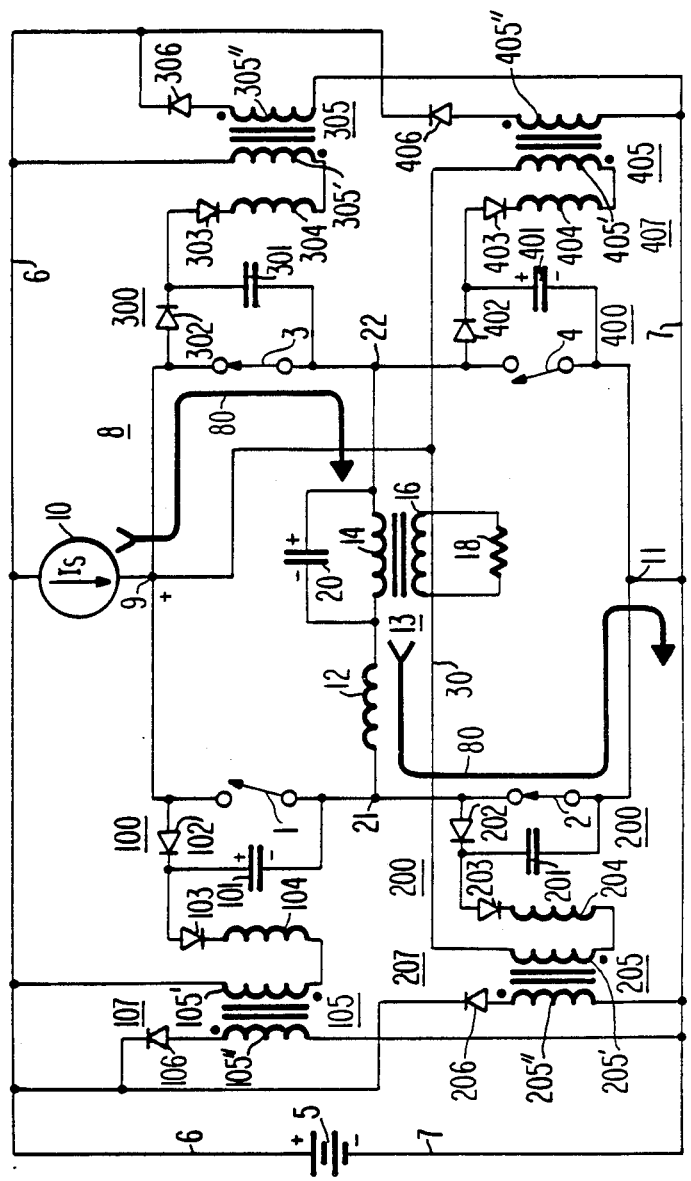
FIG. 1g is a schematic diagram corresponding to FIG. 1a illustrating snubber capacitor charge and current flows during the third operating interval (T6–T8) of the recurrent sequence.
Figure 1H:
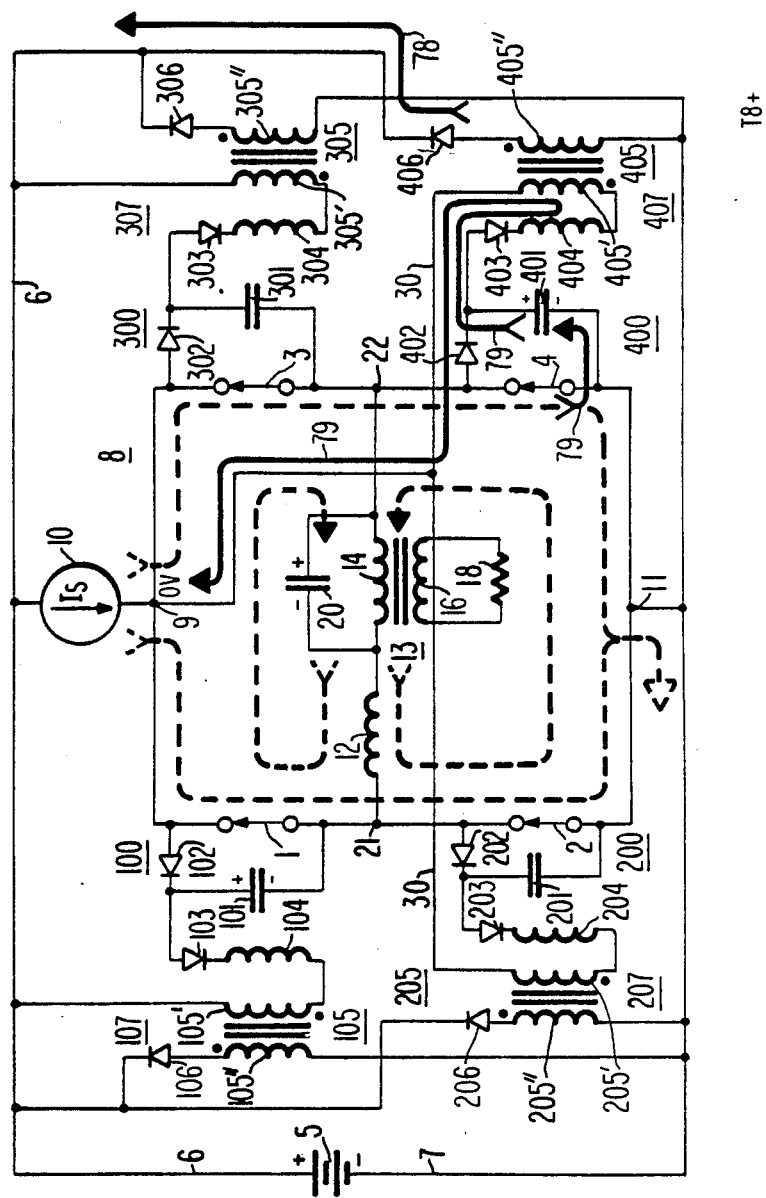
FIG. 1h is a schematic diagram corresponding to FIG. 1a which illustrates current flows during a transition from the third to a fourth operating interval of the recurrent sequence.

FIG. 1h illustrates inverter bridge 8 during the transition between the third operating mode which exists during the third interval T6-T8 of the recurrent sequence of four intervals as illustrated in FIG. 1g and a fourth mode of operation which exists during a fourth interval of the recurrent sequence. The fourth interval extends from time T8 until the next following time T0, as described below in conjunction with FIGS. 1i, 1j and 1k. FIG. 1h, however, pertains only to the transition between the third and fourth intervals in order to better explain the flow of currents resulting from the transition. For this reason, FIG. 1h is identified by the legend T8+. At time T8, switches 1 and 4 become closed, whereby all four switches are again closed. Nodes 9 and 11 are once again short-circuited, and nodes 21 and 22 are also short-circuited. The voltage at node 9 relative to node 11 makes a negative-going transmission as illustrated by 224 of FIG. 2d at time T8, and as suggested by the symbol 0 adjacent node 9 in FIG. 1h, thereby establishing a current path by which energy recovery circuit 407 connected to capacitor 401 of snubber 400 may discharge capacitor 401. Capacitor 401 discharges in a path illustrated by heavy lines as 79. Current flow in path 79 flows from the positive electrode of capacitor 401 through diode 403, inductor 404, primary winding 405', and by way of conductor 30 to node 9. Current returns from node 9 to the negative terminal of capacitor 401 by closed switches 1 through 4. Capacitor 401 produces a pulse of current in path 79 illustrated as 79 of FIG. 2h, which ends at a time T230. The flow of current in path 79 through primary winding 405' produces a stepped-up voltage across secondary winding 405", poled to forward-bias diode 406 for producing a pulse of current illustrated by heavy shading as 78 which returns to the positive terminal of voltage source 5 by way of conductor 6, thereby returning energy to source 5 during the discharge of snubber capacitor 401.

Capacitor 101 of snubber circuit 100 is not discharged at time T8, and no switches are opening at time T8 which might cause charging of snubber capacitors 201 or 301. Consequently, capacitors 201 and 301 remain uncharged in the interval T8-T10, and capacitor 101 remains charged.

Figure 1I:
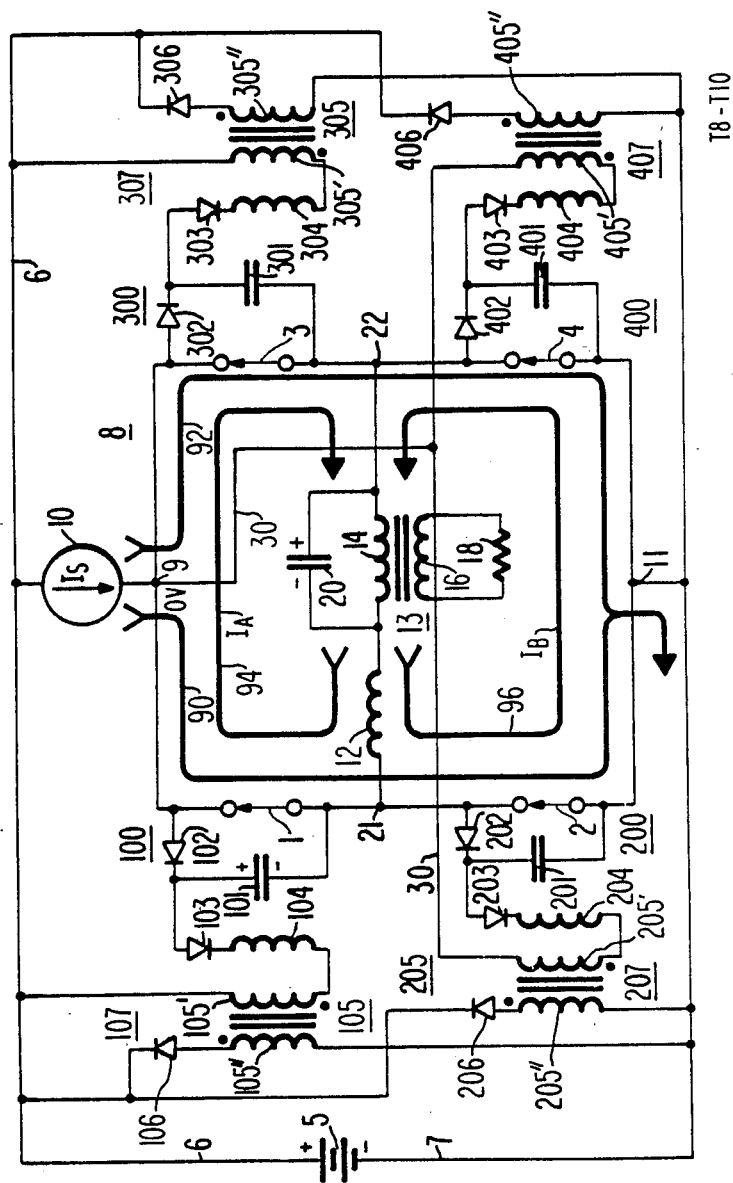
FIGS. 1i–1k are schematic diagrams corresponding to FIG. 1a which illustrate snubber capacitor charge and current flows during the fourth interval (T8–T0) of the recurrent sequence.

FIG. 1i illustrates current flows in the interval T8-T10 of the fourth interval of the recurrent series of four operating intervals (other than the transient currents occurring at times T8+ illustrated in FIG. 1h). With nodes 9 and 11 shorted, the current of magnitude $I_S$ produced by current source 10 divides at node 9 into currents 90 and 92, each of magnitude $I_S/2$, as described above. With switches 1,2,3 and 4 conductive, nodes 21 and 22 are short-circuited by paths $I_A$ and $I_B$ as described above. AT time T8, current was flowing from right to left through load 14 and inductor 12 with magnitude $I_S$, as illustrated in FIG. 1g. As mentioned, the energy stored in the form of magnetic fields about inductor 12 causes the current therethrough to continue to flow when the drive voltage is removed. Consequently, currents illustrated in FIG. 1i by heavy lines 94 and 96 flow by way of current paths $I_A$ and $I_B$ from inductor 12 through node 21, node 22 and back to inductor 12. Immediately after time T8, currents 90 and 96 add in switch 2, and currents 92 and 94 add in switch 3, so that the net current through switches 2 and 3 has magnitude $I_S$. Also immediately after time T8, currents 90 and 94 subtract in switch 1, and currents 92 and 96 subtract in switch 4, resulting in zero net current flow through switches 1 and 4. As mentioned, the remarkable result is that there is no change in the net current through the switches due to the closure of all switches.

Figure 1J:
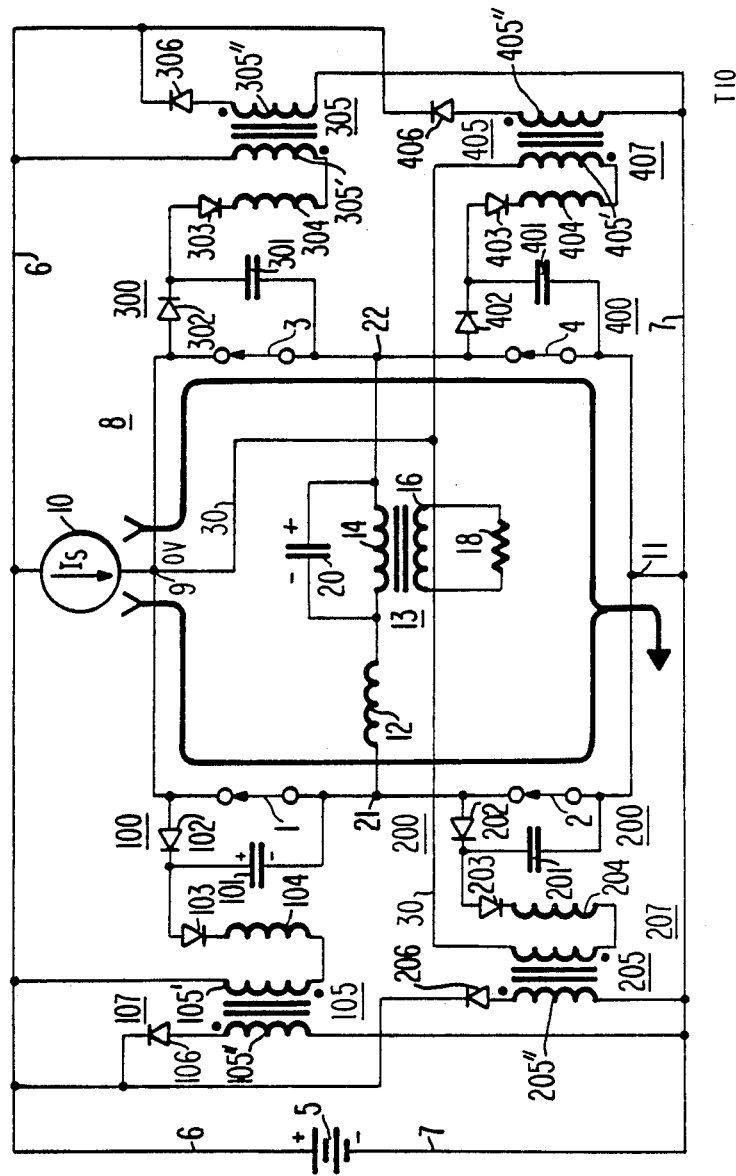
Figure 1K:
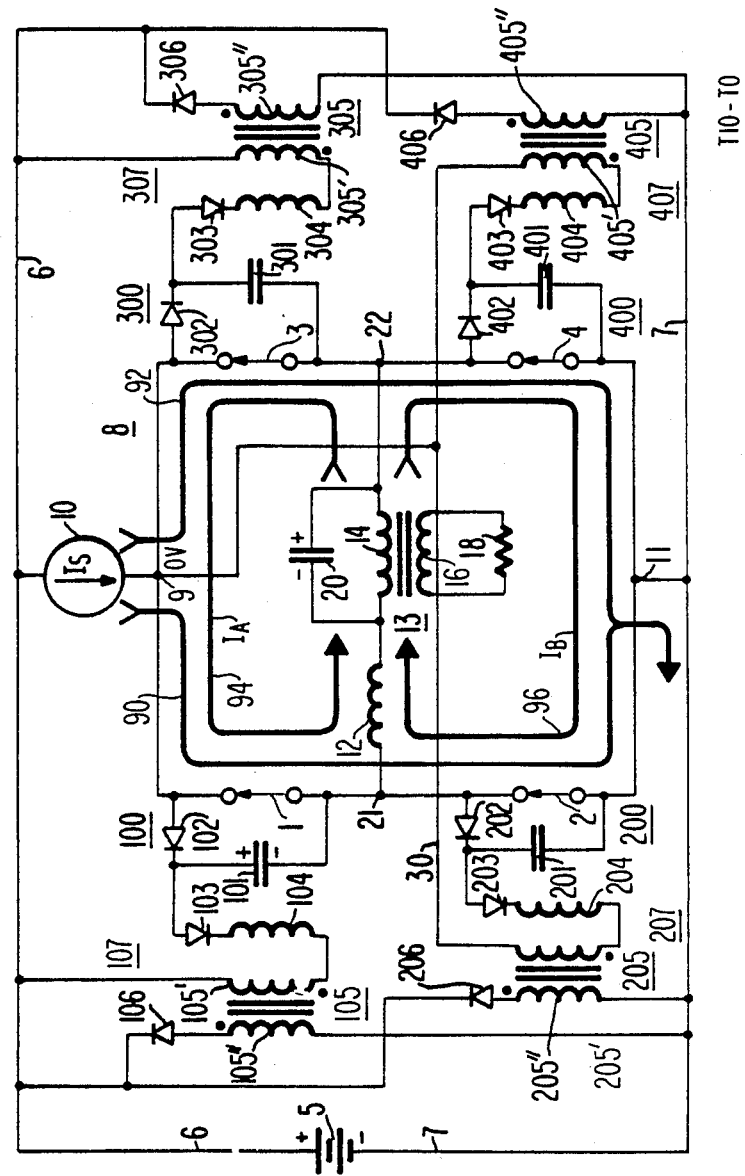

In the interval T8-T10, currents 94 and 96 as illustrated in FIG. 1i decrease in magnitude as the energy stored in the magnetic fields about inductor 12 diminish. At time T10, currents 94 and 96 become zero in magnitude. FIG. 1j illustrates circuit conditions at time T10. Currents 94 and 96 are not illustrated, because they have zero magnitude. Capacitor 20 is charged in the polarity illustrated. Immediately after time T10, currents 94 and 96 begin the flow in current paths $I_A$ and $I_B$, as illustrated in FIG. 1k, representing the interval T10-T0. Currents 94 and 96 increase in magnitude under the impetus of the voltage on capacitor 20. The directions of current flow in interval T10-T0 are such as to increase the net currents in switches 1 and 4 and to decrease the net currents through switches 2 and 3. At time T0, currents 94 and 96 reach their maximum magnitude at the moment the energy stored in the form of voltage across capacitor 20 reaches zero.

Figure 1M:
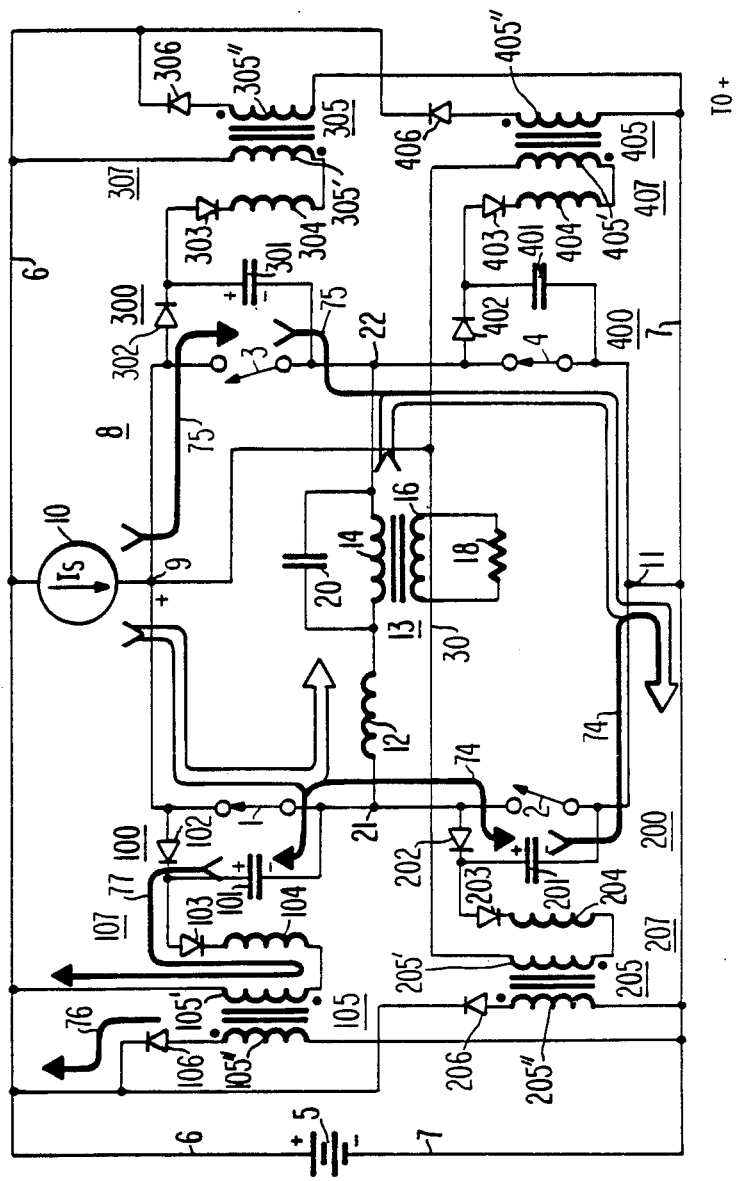

FIG. 1m (bearing the legend T0+) illustrates the currents flowing during the transition between the fourth interval (T8-T0) and the first interval (T0-T2) of the recurrent sequence of four intervals. As mentioned above, just before time T0, capacitor 101 was charged. At time T0, switches 2 and 3 are opened, thereby allowing the voltage at nodes 9 and 21 to make a positive-going transition. The transition at node 9 results in a positive voltage on node 9 which is indicated by the symbol + adjacent the node. The positive-going transition applied to the negative terminal of capacitor 101 causes the positive electrode of capacitor 101 to have a voltage greater than that of voltage source 5. Diode 103 becomes forward-biased, and current discharging from capacitor 101 flows through a path 77 illustrated by heavy shading through capacitor 101, diode 103, inductor 104 and primary winding 105' of transformer 105. The current path through the negative electrode of capacitor 101 is made by any one of several paths through node 21. The flow of current 77 through primary winding 105' creates a stepped-up voltage across secondary winding 105" poled to forward-biased diode 106 and return a current illustrated as 76 to voltage source 5. Current pulse 77 which discharges capacitor 101 is illustrated in FIG. 2g as ending at a time T236.

The opening of switches 2 and 3 at time T0 causes capacitors 201 and 301 of snubbers 200 and 300, respectively, to be charged by currents illustrated in FIG. 1m as 74 and 75, respectively. The flow of currents 74 and 75 is of short duration, and ends at a time such as time T234 as illustrated in FIGS. 2e and 2f, respectively. Consequently, capacitors 101 and 401 remain uncharged during first operating interval T0-T2, and capacitors 201 and 301 maintain a charge throughout the interval. This will be recognized as the starting condition of the sequence of four operating intervals, which is illustrated in FIG. 1a.

The sequence of four operating intervals continues indefinitely, sequencing through operating conditions illustrated in FIGS. 1a-1m.

It should be noted at this time that the purpose of inductors 104, 204, 204 and 404 of energy recovery circuits 107, 207, 307 and 407, respectively, is to decrease the peak magnitude of the energy recovery pulses by forming the discharge paths of the snubber capacitors into series inductance-capacitance (LC) circuits which discharge in a half-cycle oscillation. This has the effect of tending to fully discharge the associated snubber capacitor and also reduces the peak discharge currents for reduced $I^2R$ losses. The reduce $I^2R$ losses allows more of the snubber energy to be returned to the voltage source.

Figure 3:
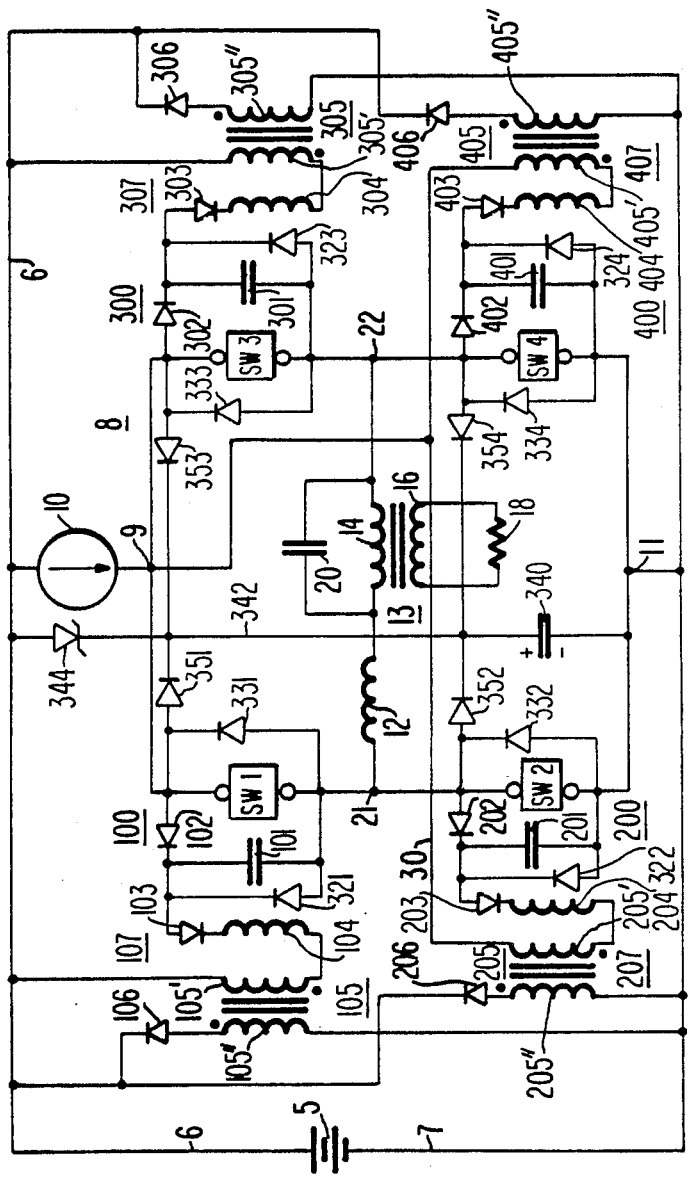
FIG. 3 is a more detailed schematic diagram of the embodiment of the invention illustrated in simplified form in FIGS. 1a–1m.

FIG. 3 is a schematic diagram corresponding to FIG. 1a illustrating additional diodes 321, 322, 323 and 324 coupled across snubber capacitors 101, 201, 301 and 401, respectively, poled to prevent reverse bias across the snubber capacitor resulting from series-resonant energy recovery operation.

Also included in FIG. 3 are further diodes 331, 332, 333 and 334 coupled across switches 1, 2, 3 and 4, respectively, for preventing reverse bias of the switch. FIG. 3 also illustrates a clamp circuit including a clamp capacitor 340 having its negative electrode connected to node 11 and its positive electrode connected to a conductor 342. A zener diode 344 has its anode connected to conductor 6 and its cathode connected to conductor 342. At initial turn-on of the circuit, zener diode 344 is forward-biased and conducts to bring the voltage across capacitor 340 to within a few tenths of a volt of the source voltage. Further diodes 351, 352, 353 and 354 have their anodes connected to the anodes of snubber diodes 102, 202, 302 and 402, respectively, and their cathodes connected to conductor 342. When any one of diodes 351, 352, 353 or 354 conducts as a result of a voltage surge at its associated switch, capacitor 340 will absorb the charge to limit the voltage across the associated switch to the capacitor voltage. When the voltage across capacitor 340 reaches the sum of the voltage of source 5 plus the zener or avalanche voltage of diode 344, diode 344 will conduct to limit the capacitor voltage and thereby protect the associated switch from overvoltage.

Figure 4:
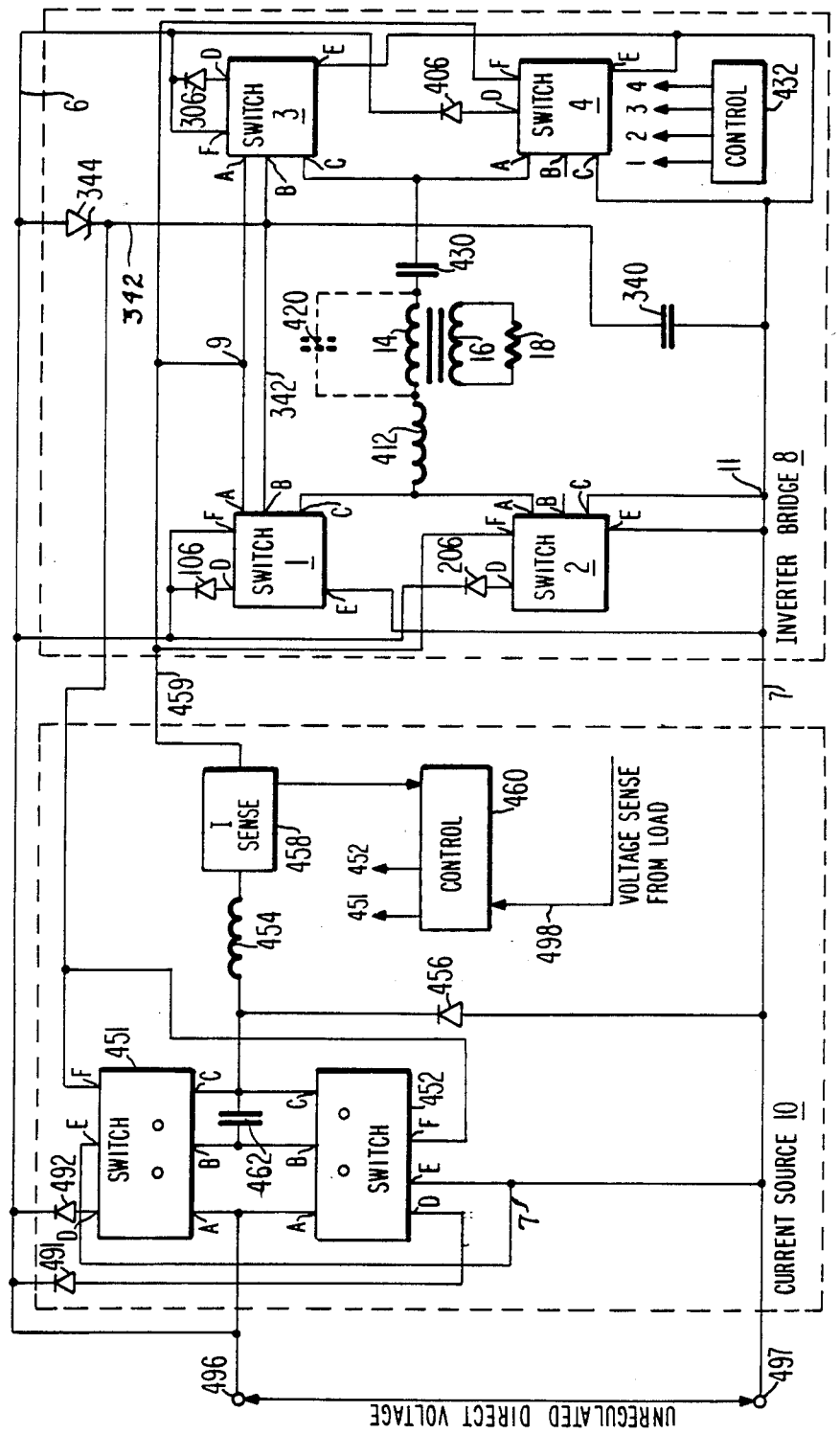
FIG. 4 is a diagram in block and schematic form illustrating details of the arrangement of FIG. 3.

FIG. 4 is an overall block diagram of current source 10 and inverter 8. In FIG. 4, elements corresponding to those of FIGS. 1a-1m and FIG. 3 are designated by the same reference numerals. In FIG. 4, terminal 496 and 497 at the left are adapted for receiving unregulated direct voltage from source 5 (not illustrated in FIG. 4) and for coupling the direct voltage to conductors 6 and 7. Current source 10 includes identical bipolar switch assemblies 451 and 452 having A, B, C, D, E, and F terminals. The A terminals of switch assemblies 451 and 452 are connected to terminal 496. The C terminals of switch assemblies 451 and 452 are coupled together and to inductor 454 for supplying current to inductor 454 from terminal 496 when switch assemblies 451 and 452 are conductive. The cathode of a free-wheeling diode 456 is connected to terminal C of switch assemblies 451 and 452, and its anode is connected to terminal 497 for maintaining current through inductor 454 during those intervals in which switch assemblies 451 and 452 are nonconductive. The current flow through inductor 454 is applied by way of a current sensing element 458 and a conductor 459 to node 9 of inverter bridge 8. A voltage representative of the sensed current is applied from current sense element 458 to a control circuit 460 for overcurrent limit control. Control circuit 460 also receives a sample of load voltage by a conductor 498 from the ultimate load (load 18) for controlling the conductive and nonconductive intervals of switch assemblies 451 and 452 in a well-known feedback manner for maintaining a substantially constant current through conductor 459 and therefore through node 11 and conductor 7. The B terminals of switch assemblies 451 and 452 are connected together and are also connected by way of a capacitor 462 to their C terminals for purposes described below.

Switches 1, 2, 3 and 4 of inverter bridge 8 are implemented as switch assemblies identical to switch assemblies 451 and 452. Their connections are substantially identical to those described in detail in conjunction with FIG. 3, except that inductor 12 is replaced by the leakage inductance (illustrated as an inductor 412) of winding 14, the capacitance with which inductance 412 resonates is the self-capacitance (distributed capacitance, illustrated as 420) of the windings of primary winding 14, and a capacitor 430 is illustrated as being in series with inductor 412 and with winding 14 for preventing any tendency to transformer saturation due to any slight current imbalance which might occur. The B terminals of switch assemblies 1 and 3 are connected together by conductor 342 and are also connected to clamp capacitor 340 and to zener diode 344. A control circuit illustrated as 432 provides timed square wave drive to switch assemblies 1, 2, 3 and 4.

Figure 5:
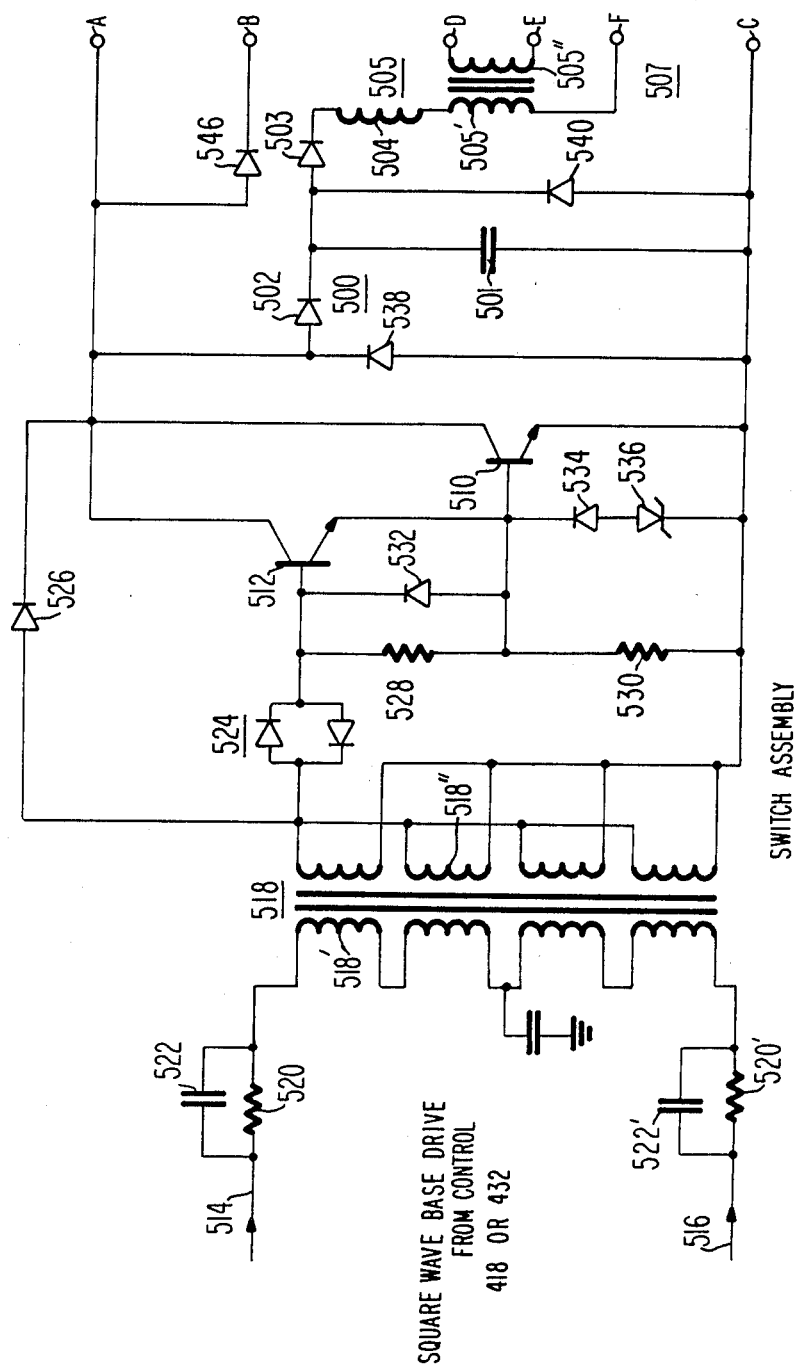
FIG. 5 is a schematic diagram of a portion of FIG. 4.

FIG. 5 is a schematic diagram of a switch assembly of FIG. 4. In FIG. 5, a bipolar transistor 510 has its collector connected to terminal A and its emitter connected to terminal C to provide a main path for current flow between terminals A and C. Base drive for transistor 510 is provided by a transistor 512 connected in a Darlington-like manner for providing enhanced gain and to also provide a further path for the flow of current between terminals A and C by way of the collector-to-emitter path of transistor 512 and the base-to-emitter path of transistor 510. Base drive is applied to transistor 512 from base drive input terminals 514 and 516 by way of a transformer designated generally as 518 which has series-connected primary windings 518′ to maintain a relatively high input impedance and parallel-connected secondary windings 518″ for low impedance base drive. A pair of resistors 520, 520′0 is connected between primary winding 518′ and terminals 514, 516 respectively. Speed-up capacitors 522, 522′ are connected across resistors 520, 520′ respectively. Secondary winding 518″ of transformer 518 applies base drive to transistor 512 by way of antiparallel-connected diodes designated generally as 524. Diodes 524 in conjunction with a further diode 526 connected between the collector of transistor 510 and secondary winding 518″ is part of a "Baker clamp" drive circuit which prevents transistors 510 and 512 from going into saturation during their conductive interval, which aids in reducing their turn-off time. A voltage divider including resistors 528, 530 is connected between the base of transistor 512 and terminal C. A diode 532 is connected across resistor 528, and a diode 534 is connected across resistor 530, both to prevent rectification of the base drive current and thereby aid in reducing saturation of transformer 518. A zener diode 536 is connected in series with diode 534 to compensate for the voltage drop across the base-emitter junction of transistor 510 attributable to the heavy base current flow in the resistive component of the base-emitter diode impedance. A diode 538 has its cathode connected to terminal A and its anode connected to terminal C to prevent any possibility of application of reverse voltage to transistors 510 and 512. A diode 502 and a capacitor 501 together constitute a snubber 500. Reverse voltage across snubber capacitor 501 is prevented by a diode 540 connected across the capacitor and having its anode connected to terminal C. While it might appear that diode 540 is redundant, since the series combination of doides 502 and 538 is in parallel with capacitor 501, it is advantageous because of unavoidable limitations on the ratings of diodes 502 and 538. Energy recovery network 507 includes a diode 503 having its anode coupled to the junction of capacitor 501 and diode 502, and connected in series with a diode 503, an inductor 504, the primary winding 505′ of a transformer 505, and a terminal F. Reference to FIG. 4 shows that terminals F of switch assemblies 1 and 3 are connected to conductor 6, and terminals F of switch assemblies 2 and 4 are connected to node 9. The secondary winding 505″ of transformer 505 is connected to terminals D and E, which by reference to FIG. 4 may be seen to be connected to the anode of a diode (106, 206, 306, 406) and to node 11, respectively. Terminals F of switch assemblies 451 and 452 are connected together and to conductor 342 to discharge their respective snubber capacitors (501 of FIG. 5) to a voltage higher than that of the unregulated source voltage presented by source 5 at terminals 496 and 497 (FIG. 4). Terminals D of switch assemblies 451 and 452 are connected to conductor 6 by the anode-to-cathode paths of diodes 491 and 492, respectively, and terminals E are interconnected with conductor 7.

Figure 6:
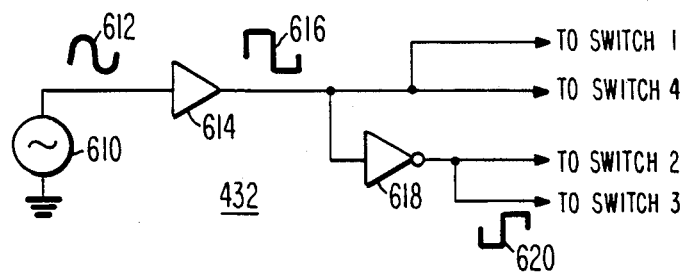
FIG. 6 is a simplified schematic diagram of a control circuit which may be used in the arrangement of FIG. 4.

FIG. 6 illustrates a simplified form of control circuit 432. In FIG. 6, control circuit 432 includes an oscillator 610 which oscillates at the inverter frequency, such as 10 KHz, to produce a sinusoidal waveform illustrated as 612. Sinusoidal signal 612 is applied to a saturating amplifier 614 to produce a square wave illustrated as 616 which is applied as base drive to switches 1 and 4. Square wave 616 is also applied to an inverting amplifier 618 which produces an inverted or out-of-phase squarewave 620 which is applied as base drive to switches 2 and 3.

Figure 7:
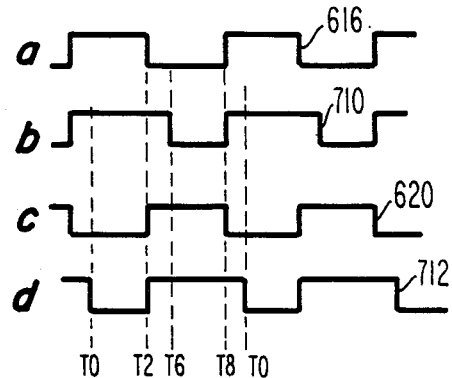
FIG. 7 is a timing diagram of transistor drive produced by the control circuit of FIG. 6, and the resulting conduction of the transistors of FIG. 5.

FIG. 7a illustrates square wave 616, and FIG. 7c illustrates square wave 620. FIG. 7b represents as 710 the conductive interval of a bipolar transistor switch such as switch 1 or 4 in response to square wave 616. A high level of waveform 710 represents a conductive interval and a low level represents a nonconductive interval. As illustrated, the conductive intervals represented by waveform 710 occur during the logic high levels of waveform 616 and for a short period thereafter. The short period of additional conduction is a well known characteristic of bipolar transistors used in switching applications, and is attributable to the length of time required to remove charge carriers from the base region after reversal of base drive. As illustrated, waveform 620 of FIG. 7c is phase inverted relative to waveform 616. FIG. 7d represents as a high level of a waveform 712 the conductive intervals of switches 2 and 3 in response to base drive by signal waveform 620 of FIG. 7c. As illustrated, switches 2 and 3 are conductive during intervals in which waveform 620 is at a logic high level, and remain conductive for a short period thereafter. Comparison of the conductive periods represented by waveforms 710 and 712 shows that there is overlap in the conduction during the intervals T2–T6 and T10–T0, corresponding to the intervals T2–T6 and T10–T0 of FIGS. 1a–1m and FIG. 2. Thus, a nonoverlapping base drive may result in conduction overlap when bipolar switch transistors are used.

Figure 8:
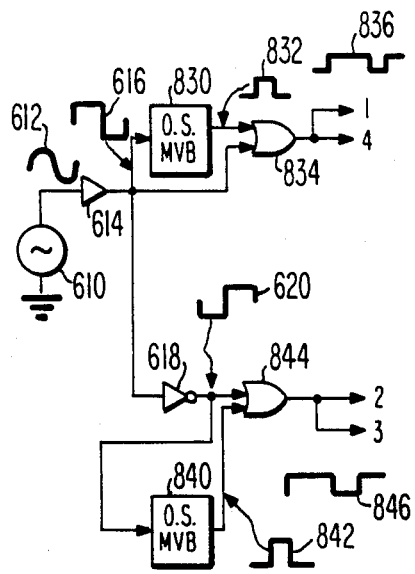
FIG. 8 is a simplified schematic diagram of another control circuit which may be used in the arrangement of FIG. 5.
Figure 9:
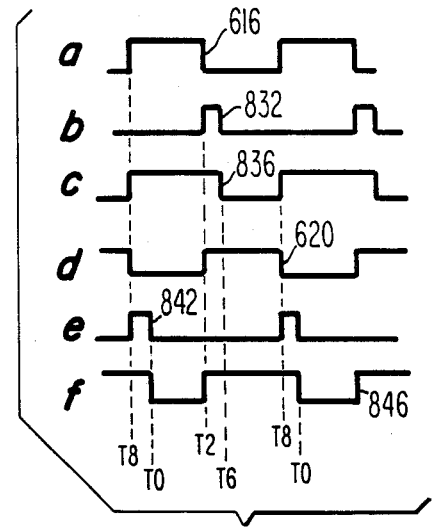
FIG. 9 is a timing diagram illustrating the operation of the control circuit of FIG. 8.

If FET switches are used rather than bipolar switches, or if the overlap period provided by the use of bipolar transistors is insufficient, the arrangement of FIG. 8 may be used for control of the switches of inverter bridge 8. Elements of FIG. 8 corresponding to those of FIG. 6 are designated at the same reference numerals. In FIG. 8, the square wave 616 at the output of saturating amplifier 614, instead of being applied as base drive directly to switches 1 and 4, is applied to an input of an OR gate 834 and to an input of a one-shot multivibrator (OSMVB) 830 which produces a short duration pulse illustrated as 832 in response to negative-going transitions of waveform 616. The signal, illustrated as 836, at the output of OR gate 834 is the sum of the logic high portions of waveform 616 and 832. It will be noted that the base drive has an "ON" (logic high) level of longer duration than the "OFF" (logic low) levels. FIGS. 9a, b, and c illustrate the relative timing of square wave 616, pulse 832 and signal 836.

In FIG. 8, the inverted square wave 620 at the output of inverting amplifier 618, instead of being applied directly as base drive to switches 2 and 3, is instead applied to an input of an OR gate 844 and to the input of a OSMVB 840 which produces at its output a pulse of constant duration illustrated as 842 on each negative transition of square wave 620. OR gate 844 adds together square wave 620 and pulse 842 to produce a signal 846 which is applied as base drive to switches 2 and 3. FIGS. 9d, e and f illustrate the relative timing of square wave 620, pulse 842 and resulting signal 846, and also the relative timing between waveforms 836 and 846. As illustrated, there is an overlap in conduction as represented by waveforms 836 and 846 in the intervals T2–T6 and T8–T0.

Other embodiments of the invention will be apparent to those skilled in the art. In particular, the switches may be opened at times which are not at current minima, but at times when the current is less than $I_s/2$, and a benefit will be obtained. Inductors which are serially connected with transformer windings may be implemented as leakage inductance of the transformer, without a discrete inductor. Clamp zener diode 344 (FIG. 3) may be replaced by a resistor, thereby improving component reliability at the cost of a "soft" clamp voltage.

What is claimed is:

1. An inverter adapted to be operated from a source of direct voltage, comprising:
   a source of direct current adapted to be coupled to first and second terminals of a source of direct voltage for being energized thereby, for producing a substantially constant current between first and second terminals of said source of direct current;
   a first series combination of first and second controllable switches including a first intermediate terminal therebetween, said first series combination being coupled across said first and second terminals of said source of direct current;
   a second series combination of third and fourth controllable switches including a second intermediate terminal therebetween, said second series combination being coupled in parallel with said first series combination;
   a load coupled to said first and second intermediate terminals for receiving alternating current from said first, second, third and fourth switches in response to operation of said switches;
   control means coupled to said first, second, third and fourth switches for, in recurrent sequence of four sequential intervals, controlling said first, second, third and fourth switches for (a) maintaining said first and fourth switches conductive and said second and third switches nonconductive during first intervals of said recurrent sequence, (b) maintaining said first, second, third and fourth switches conductive during second intervals of said recurrent sequence, (c) maintaining said first and fourth switches nonconductive and said second and third switches conductive during third intervals of said recurrent sequence, and (d) maintaining said first, second, third and fourth switches conductive during fourth intervals of said recurrent sequence;
   first, second, third and fourth snubbers coupled to said first, second, third and fourth switches, respectively, each of said first, second, third and fourth snubbers including the serial combination of a diode and capacitance means, said capacitance means being coupled for being charged in a first polarity by current bypassing the associated switch during its turn-off, whereby the snubber capacitor becomes charged in said first polarity and must be discharged in preparation for receiving current during the next turn-off cycle;
   first, second third and fourth energy recovery means coupled to said capacitance means of said first, second, third and fourth snubbers, respectively; said first, second, third and fourth energy recovery means including first, second, third and fourth transformer means, each of said transformer means including a primary and a secondary winding, said secondary windings of each of said transformer means being coupled in series with rectifying means across said first and second terminals of said source of direct voltage, said primary windings of said first, second, third and fourth transformer means each being coupled in series with further rectifying means to form first, second, third and fourth primary circuits, one end of each of said first, second, third and fourth primary circuits being coupled to the junction of said diode and said capacitance means of said first, second, third and fourth snubbers, respectively, the other end of said first and third primary circuits being coupled to said first terminal of said source of direct voltage, the other end of said second and fourth primary circuits being coupled to said first terminal of said source of direct current, for transforming current pulses from said capacitance means of said snubbers to said source of direct voltage for recovering energy while discharging said capacitance means of said snubbers in preparation for receiving current during the next turn-off cycle.

2. An inverter according to claim 1 further comprising first, second, third and fourth inductance means serially coupled with said first, second, third and fourth primary circuits, respectively.

3. An inverter according to claim 2 further comprising voltage limiting means coupled across said capacitance means of each of said first, second, third and fourth snubbers for preventing imposition of a significant charge on said capacitance means in a second polarity opposite to said first polarity.

4. An inverter according to claim 1 wherein said load comprises inductance means and capacitance means dimensioned for resonating during said second and fourth intervals of said recurrent sequence for periodically reducing the net current through said first and fourth switches in preparation for said third intervals of said recurrent sequence and for periodically reducing the current through said second and third switches in preparation for said first intervals of said recurrent sequence.

5. An inverter according to claim 1 wherein each of said first, second, third and fourth switches comprises transistor switch means.

6. An inverter according to claim 5 further comprising first, second, third and fourth unidirectional current conducting means coupled across said first, second, third and fourth transistor switch means, respectively, for preventing application of significant reverse voltage thereacross.

7. An inverter adapted to be operated from a source of direct voltage, comprising:
   a source of direct current adapted to be coupled to first and second terminals of a source of direct voltage for being energized thereby, for producing a substantially constant current between first and second terminals of said source of direct current;

a first series combination of first and second controllable switches including a first intermediate terminal therebetween, said first series combination being coupled across said first and second terminals of said source of direct current;

a second series combination of third and fourth controllable switches including a second intermediate terminal therebetween, said second series combination being coupled in parallel with said first series combination;

a load coupled to said first and second intermediate terminals for receiving alternating current from said first, second, third and fourth switches in response to operation of said switches;

control means coupled to said first, second, third and fourth switches for, in recurrent sequence of four sequential intervals, controlling said first, second, third and fourth switches for (a) maintaining said first and fourth switches conductive and said second and third switches nonconductive during first intervals of said recurrent sequence, (b) maintaining said first, second, third and fourth switches conductive during second intervals of said recurrent sequence, (c) maintaining said first and fourth switches nonconductive and said second and third switches conductive during third intervals of said recurrent sequence, and (d) maintaining said first, second, third and fourth switches conductive during fourth intervals of said recurrent sequence;

first, second, third and fourth snubbers coupled to said first, second, third and fourth switches respectively, each of said first, second, third and fourth snubbers including the serial combination of a diode and capacitance means, said capacitance means being coupled for being charged in a first polarity by current bypassing the associated switch during its turn-off, whereby the snubber capacitor becomes charged in said first polarity and must be discharged in preparation for receiving current during the next turn-off cycle;

first, second, third and fourth energy recovery means coupled to said capacitance means of said first, second, third and fourth snubbers, respectively; said first, second, third and fourth energy recovery means including first, second, third and fourth transformer means, each of said transformer means including a primary and a secondary winding, said secondary windings of each of said transformer means being coupled in series with rectifying means across said first and second terminals of said source of direct voltage, said primary windings of said first, second, third and fourth transformer means each being coupled in series with further rectifying means to form first, second, third and fourth primary circuits, one end of each of said first, second, third and fourth primary circuits being coupled to the junction of said diode and said capacitance means of said first, second, third and fourth snubbers, respectively, the other end of said first and third primary circuits being coupled to said first terminal of said source of direct voltage, the other end of said second and fourth primary circuits being coupled to said first terminal of said source of direct current, for transforming current pulses from said capacitance means of said snubbers to said source of direct voltage for recovering energy while discharging said capacitance means of said snubbers in preparation for receiving current during the next turn-off cycle;

clamp capacitance means including first and second electrodes, said second electrode being coupled to said second terminal of said source of direct voltage;

first, second, third and fourth unidirectional current conducting means, each including an anode terminal and a cathode terminal, one of said anode terminals and said cathode terminals of said first, second, third and fourth unidirectional current conducting means being coupled to said first electrode of said clamp capacitance means, and other one of said anode terminals and said cathode terminals of said first and third unidirectional current conducting means being coupled to said first terminal of said source of direct current, the other one of said anodes and said cathodes of said second and fourth unidirectional current conducting means being coupled to said first and second intermediate terminals, respectively; and voltage control means coupled to said first terminal of said source of direct voltage and to said first electrode of said clamp capacitance means for establishing a clamp voltage on said clamp capacitance means whereby voltage spikes across any of said first, second, third and fourth switches which exceed said clamp voltage cause the corresponding one of said first, second, third and fourth unidirectional current conducting means to conduct and thereby limit the magnitude of the voltage spike.

8. A direct-voltage to alternating-current inverter, comprising:

a source of direct current adapted to be coupled to a source of direct voltage for being energized thereby, for producing a substantially constant current between first and second terminals;

a first series combination of first and second controllable switch means including a first intermediate terminal therebetween, said first series combination of first and second controllable switch means being coupled to said first and second terminals of said source of direct current for, when closed, conducting at least portion of said substantially constant direct current;

a second series combination of third and fourth controllable switch means including a second intermediate terminal therebetween, said second series combination of third and fourth controllable switch means being coupled in parallel with said first series combination of first and second controllable switch means for, when closed, conducting at least a portion of said substantially constant direct current;

a load coupled to said first and second intermediate terminals for having applied thereacross voltages which depend upon the combination of said first, second, third and fourth controllable switch means which are conducting;

capacitance means coupled across said load to form a parallel capacitance-load circuit;

inductance means serially coupled with said capacitance-load circuit;

switch control means coupled to said first, second, third and fourth controllable switch means for, in recurrent sequence of four intervals, (a) maintaining said first and fourth controllable switch means conductive and said second and third controllable switch means nonconductive during a first interval of said recurrent sequence, for directing said substantially constant direct current through said inductance means and said load in a first polarity, and for charging said capacitance means in a first polarity, (b) for rendering said second and third controllable switch means conductive during a second interval of said recurrent sequence, whereby said first, second, third and fourth controllable switch means are conductive, thereby reducing the voltage between said first and second intermediate terminals, and between said first and second terminals of said source of constant current to zero, and creating paths including said first, second, third and fourth controllable switch means by which said inductance means can ring with said capacitance means to form a first ringing current such that the current flow in said first and fourth controllable switch means is decreased by said ringing current, (c) for rendering said first and fourth controllable switch means nonconductive at a time when the current therethrough is less than one-half said substantially constant direct current to initiate a third interval of said recurrent sequence, whereby only said second and third controllable switch means are conductive during said third interval of said recurrent recurring sequence, whereby a voltage appears between said first and second terminals of said source of direct current and a voltage appears across said first and second intermediate terminals which is poled to cause said substantially constant direct current to flow through said inductance means and said load in a second polarity, and for charging said capacitance means in a second polarity, (d) for rending said first and fourth controllable switch means conductive during a fourth interval of said recurrent sequence, whereby said first, second, third and fourth controllable switch means are conductive, thereby reducing said voltage between said first and second intermediate terminals, and between said first and second terminals of said source of direct current to zero, and creating paths including said first, second, third and fourth switch means by which said inductance means can ring with said capacitance means to form a second ringing current in such a manner that the current flow in said second and third switch means is decreased by said ringing current, and (e) for rendering said second and third controllable switch means nonconductive at a time when the current therethrough is less than one-half said substantially constant direct current, whereby only said first and fourth controllable switch means are conductive to begin another said first interval of said recurrent sequence, whereby the rendering nonconductive of said controllable switch means when a nonzero current flows therethrough may cause switch stress and unwanted power dissipation;

first, second, third and fourth snubbing means coupled across said first, second, third and fourth controllable switch means, respectively, each of said snubbing means comprising the series combination of a diode and a capacitor, for diverting said nonzero current flowing in said first, second, third and fourth controllable switch means, respectively, at the moment said first, second, third and fourth controllable switch means, respectively, are rendered nonconductive, whereby energy is transferred into said capacitors of said second and third snubbing means at the beginning of said first interval of said recurrent sequence, and energy is transferred into said capacitors of said first and fourth snubbing means at the beginning of said third interval of said recurrent sequence;

first energy recovery means coupled to said first snubbing means, said first energy recovery means comprising the series combination of the primary winding of a first transformer and a first rectifier coupled between a terminal of said source of direct voltage and the junction of said diode and said capacitor of said first snubbing means, and also comprises the series combination of a second rectifier and a secondary winding of said first transformer connected across said source of direct voltage for transforming a current pulse from said capacitor of said first snubbing means to said source of direct voltage at the beginning of said first interval of said recurrent sequence for recovering energy from said first snubbing means;

second energy recovery means coupled to said second snubbing means, said second energy recovery means comprising the series combination of the primary winding of a second transformer and a third rectifier coupled between said first terminal of said source of direct current and the junction of said diode and said capacitor of said second snubbing means, and also comprises the series combination of a fourth rectifier and a secondary winding of said second transformer connected across said source of direct voltage for transforming a current pulse from said capacitor of said second snubbing means to said source of direct voltage at the beginning of said second interval of said recurrent sequence for recovering energy from said second snubbing means;

third energy recovery means coupled to said third snubbing means, said third energy recovery means comprising the series combination of the primary winding of a third transformer and a fifth rectifier coupled between a terminal of said source of direct voltage and the junction of said diode and said capacitor of said third snubbing means, and also comprises the series combination of a sixth rectifier and a secondary winding of said third transformer connected across said source of direct voltage for transforming a current pulse from said capacitor of said third snubbing means to said source of direct voltage at the beginning of said third interval of said recurrent sequence for recovering energy from said third snubbing means; and fourth energy recovery means coupled to said fourth snubbing means, said fourth energy recovery means comprising the series combination of the primary winding of a fourth transformer and a seventh rectifier coupled between said first terminal of said source of direct current and the junction of said diode and said capacitor of said fourth snubbing means, and also comprises the series combination of an eighth rectifier and a secondary winding of said fourth transformer connected across said source of direct voltage from transforming a current pulse from said capacitor of said fourth snubbing means to said source of direct voltage at the beginning of said fourth interval of said recurrent sequence for recovering energy from said fourth snubbing means.

9. An inverter according to claim 8 further comprising first, second, third and fourth inductance means serially coupled with said primary windings of said first, second, third and fourth transformers, respectively.

10. A method for operating a bridge inverter driven from a source of substantially constant direct current which in turn is energized from a source of direct voltage to apply alternating current to a load, comprising, in the following order, the steps of:

maintaining closed first and fourth switches of said bridge and maintaining open second and third switches of said bridge during a first interval of a recurrent sequence of four intervals for coupling said load for receiving said substantially constant direct current in a first polarity;

closing all switches of said bridge a first time, thereby short-circuiting said load and said source of substantially constant direct current to initiate a second interval of said recurrent sequence of four intervals;

simultaneously with said closing of all switches of said bridge a first time, discharging a second snubber capacitor and transferring the energy thereof to said source of direct voltage;

opening said first and fourth switches of said bridge to initiate a third interval of said recurrent sequence of four intervals for coupling said load for receiving said substantially constant direct current in a second polarity;

simultaneously with said opening of said first and fourth switches, charging first and fourth snubber capacitors respectively with a current diverted from said first and fourth switches, respectively, due to the opening thereof;

simultaneously with said opening of said first and fourth switches, discharging a third snubber capacitor and transferring the energy thereof to said source of direct voltage;

closing all switches of said bridge a second time, thereby short-circuiting said load and said source of substantially constant direct current to initiate a fourth interval of said recurrent sequence of four intervals;

simultaneously with said closing of all switches of said bridge a second time, discharging said fourth snubber capacitor and transferring the energy thereof to said source of direct voltage;

opening said second and third switches to initiate said first interval of said recurrent sequence of four intervals, thereby coupling said load for receiving said substantially constant direct current in said first polarity;

simultaneously with said opening of said second and third switches, charging said second and third snubber capacitors, respectively, with current diverted from said second and third switches, respectively, due to the opening thereof; and simultaneously with said opening of said second and third switches, discharging said first snubber capacitor and transferring the energy thereof to said source of direct voltage.

* * * * *